(12) United States Patent
Pichler et al.

(10) Patent No.: US 6,850,003 B1
(45) Date of Patent: Feb. 1, 2005

(54) SELF-ASSEMBLED TRANSPORT LAYERS FOR OLEDS

(75) Inventors: Karl Pichler, Cupertino, CA (US); Jeremy Burroughes, Cambridge (GB); Peter Ho, Cambridge (GB); Chris Bright, Huntingdon (GB); Richard Henry Friend, Cambridge (GB); Neil Clement Greenham, Cambridge (GB)

(73) Assignee: Cambridge Display Technology, Ltd., Cambridge (GB)

( * ) Notice: Subject to any disclaimer, the term of this patent is extended or adjusted under 35 U.S.C. 154(b) by 0 days.

(21) Appl. No.: 09/508,034

(22) PCT Filed: Sep. 4, 1998

(86) PCT No.: PCT/GB98/02671

§ 371 (c)(1),
(2), (4) Date: Jun. 6, 2000

(87) PCT Pub. No.: WO99/13692

PCT Pub. Date: Mar. 18, 1999

(30) Foreign Application Priority Data

Sep. 5, 1997 (GB) .............................................. 9718920
Mar. 13, 1998 (GB) .............................................. 9805478
May 21, 1998 (GB) .............................................. 9811014

(51) Int. Cl.$^7$ .......................... H01J 1/62; H01J 63/04; B05D 1/06; B05D 1/18; B05D 1/04
(52) U.S. Cl. .......................... 313/506; 427/469; 427/66; 427/430.1; 427/443.2; 427/458
(58) Field of Search ........................ 427/469, 66, 430.1, 427/443.2, 458; 313/506

(56) References Cited

U.S. PATENT DOCUMENTS 5,156,918 A    10/1992  Marks et al. ................ 428/447
5,208,111 A  *  5/1993  Decher et al. ............... 428/420
5,213,898 A  *  5/1993  Larm et al. .................. 428/422
5,247,226 A     9/1993  Sato et al. .................... 313/504
5,276,290 A  *  1/1994  Bladon ........................ 174/262
5,798,170 A  *  8/1998  Zhang et al. ................ 428/212
5,946,550 A  *  8/1999  Papadimitrakopoulos .... 438/99
6,399,221 B1 *  6/2002  Marks et al. ................ 428/690

FOREIGN PATENT DOCUMENTS

EP          0701290 A1    3/1996

* cited by examiner

Primary Examiner—Nimeshkumar D. Patel
Assistant Examiner—Matt Hodges
(74) Attorney, Agent, or Firm—Finnegan, Henderson, Farabow, Garrett and Dunner, LLP

(57) ABSTRACT

Provided is a method of fabricating an organic light-emitting device; which method comprises the steps of: forming a first electrode (4) for the device over a substrate (2); either forming by self-assembly at least one polymer layer (6, 8) over the first electrode (4) and forming other than by self-assembly at least one layer of organic light emissive material (10) over the at least one polymer layer (6, 8); and forming a second electrode (12) for the device over the at least one layer of organic light emissive material (10); or forming other than by self-assembly at least one layer of organic light emissive material over the first electrode and forming by self-assembly at least one polymer layer over the at least one layer of organic light emissive material; and forming a second electrode for the device over the at least one polymer layer. Also provided is an organic light emitting device, obtainable according to the method of the present invention.

44 Claims, 16 Drawing Sheets

(b)

(c)    (d)

(e)

(f)

Maximum forward luminance under d.c. drive
p-ITO denotes conventional device Silyl Coupling Layer

PEDOT-PSS

F8

IgJ-V Summary

V-IgL Summary

SELF-ASSEMBLED TRANSPORT LAYERS FOR OLEDS

The present invention relates to an improved fabrication process for organic light-emitting devices, and a structure formed thereby.

Organic light-emitting devices (OLEDs) such as described in earlier U.S. Pat. No. 5,247,190 assigned to Cambridge Display Technology Limited, or in Van Slyke et al., U.S. Pat. No. 4,539,507, the contents of which are herein incorporated by reference and example, have great potential for use in various display applications, such as large-area flat-panel displays. Principally; an OLED consists of an anode that injects positive charge carriers, a cathode that injects negative charge carriers and at least one organic electroluminescent layer sandwiched between the two electrodes. Under application of a positive bias to the anode, holes are injected from the anode and electrons from the cathode. These carriers recombine within the organic electroluminescent layer, giving out light.

Typically, although not necessarily, the anode is a thin film of, for example, indium-tin-oxide (ITO), which is a semitransparent conductive oxide, which is commercially readily available already, deposited on glass or plastic substrates. The organic layer(s), typically a thin (100–1000 nm) layer of conjugated polymer, is normally deposited onto the ITO-coated substrate by, for example, evaporation, or any one of spin-coating, blade-coating, dip-coating or meniscus-coating. The final step of depositing the cathode layer, typically a low work-function metal electrode, onto the organic layer is normally performed by thermal evaporation or sputtering of a suitable cathode metal. Layers of Al, Ca or alloys of Mg:Ag or Mg:In or Al alloys are often used as cathode materials.

One on the key advantages of the OLED technology is that devices can me operated at low drive voltages, provided that suitable electro-luminescent organic layers, and electrodes with good efficiencies for the injection of positive and negative charge carriers, are used.

Key performance parameters for the performance of a polymer LED are the quantum efficiency (the number of emitted photons per charge carrier flowing in the circuit), and the drive voltage required to achieve a given light output. Another important parameter is the power efficiency (the ratio of optical power output to electrical power input). High power efficiency requires both high quantum efficiency and low drive voltage. Further important parameters in polymer LEDs are the maximum brightness achievable, the ease and reproducibility of manufacture, and the operating lifetime.

In order to achieve good performance in OLEDs it is of great importance to optimise all individual layers, the anode, the cathode and the organic layer(s), as well as the interfaces between the layers.

The provision of a thin, very well defined polymer layer between either one of the cathode or anode and the organic layer, a so-called interfacial layer, can improve device performance. However, it is essential to achieve the improved performance that such layer is fabricated under extremely well controlled conditions. Controlling the thickness in the nanometer regime is important to optimise the device performance.

A technique known as self-assembly can be used to build a well-defined polymer layer. The technique of polymer self-assembly comprises building up a polymer film by adsorption of successive polymer layers from solution. The technique relies on attractive interaction between successive layers, and requires that each layer formed is dissimilar to the previous layer formed. Typically a repeating sequence of polymer layers may be used, such as ABAB . . . , or ABCDABCD . . . , where A, B, C, and D denote respective dissimilar layers.

Polymer light emitting devices fabricated using a self-assembly process are described in A. C. Fou, O. Onitsuka, M. Ferreira and M. F. Rubner, "Interlayer interactions in self-assembled poly(phenylenevinylene) multilayer heterostructures: implications for light-emitting and photorectifying diodes," Mat. Res. Soc Symp. Proc., Vol. 369, pp. 575–580, 1995; and A. C. Fou, O. Onitsuka, M. Ferreira, M. F. Rubner and B. R. Hsieh, "Fabrication and properties of light-emitting diodes based on self-assembled multilayers of poly(phenylene vinylene)," J. Appl. Phys., Vol. 79, pp. 7501–7509, 1996.

In these references a technique of self-assembly is utilised using polycations and polyanions described in G. Decher, J. D. Hong and J. Schmitt, "Buildup of ultrathin multilayer films by a self-assembly process. 3. Consecutively alternating adsorption of anionic and cationic polyelectrolytes on charged surfaces," Thin Solid Films, Vol. 210, pp. 831–835, 1992. In these structures PPV precursor or its derivatives are used as the polycation, with various polyanions such as polystyrenesulfonate or sulphiniated polyaniline. Poly(p-pyridylvinylene) and its derivatives have also been used to make self-assembled LEDs.

The process of producing by self-assembly a film of sufficient thickness to give a working LED is extremely time-consuming, due to the number of dipping and rinsing steps involved. In the work described above, the entire device was completed by self-assembly, thus retaining the problem of many dipping steps. This method is unlikely to be commercially viable.

It is therefore an object of the present invention to provide a structure, and fabrication process, in which a well-defined, thin, polymer interfacial layer may be provided between an electrode and the electroluminescent material of an OLED without unduly inhibiting the standard commercial fabrication process.

Thus, according to a first aspect of the present invention there is provided a method of fabricating an organic light-emitting device, comprising the steps of: forming a first electrode for the device over a substrate; forming, by self-assembly, at least one polymer layer over the first electrode; forming, other than by self-assembly, at least one layer of organic light emissive material over the at least one polymer layer; and forming a second electrode for the device over the at least one layer of organic light emissive material.

This first aspect of the present invention also provides a method of fabricating an organic light-emitting device, comprising the steps of: forming a first electrode for the device over a substrate; forming, other than by self-assembly, at least one layer of organic light emissive material over the first electrode; forming, by self-assembly, at least polymer layer over the at least one layer of organic light emissive material; and forming a second electrode for the device over the at least one polymer layer.

Thus in the first aspect of the present invention, self-assembly has been used to form at least one layer of additional polymer at an electrode/light-emissive layer interface. The rest of the device is then completed using standard techniques such as spin coating. This first aspect of the present invention has the benefits of rapid processing, with the enhancements of well-controlled layers at the polymer interface.

Thus the first aspect of the present invention gives a reduction in processing time and cost compared with prior art devices fabricated entirely by self-assembly Significant improvement in quantum efficiency, drive voltage, power efficiency and/or maximum luminance compared with devices without the interfacial layer are obtained, as well as improvements in device lifetime.

Quantum efficiency is significantly enhanced over a range of interfacial layer thicknesses, whereas the drive voltage begins to increase with the thicker layers. Optimum power efficiency therefore occurs at an intermediate thickness. This thickness is smaller than car typically be achieved with spin-coated interfacial layers. Self-assembly provides thin, continuous, well-defined films in this thickness regime. This is an ideal technique for producing pin-hole free films in this thickness regime.

The at least one self-assembled polymer layer preferably comprises one or more pairs of co-operating sub-layers, and the at least one organic light emissive layer comprises a continuous layer having the same composition throughout.

The at least one self-assembled polymer layer may be any one of an insulating polymer, a semiconducting polymer, or a conducting polymer. Deposition, by self-assembly, of insulating, semiconducting or conducting polymer interfacial layers in OLEDs allows further optimisation of device performance.

The pair of co-operating sub-layers interact by attractive forces, each sub-layer being dissimilar to the other. Preferably one sub-layer of the pair is positively charged and the other sub-layer of the pair is negatively charged.

Preferably the positively charged sub-layer of the pair is formed by immersing the substrate in a polycation electrolyte solution and the negatively charged sub-layer of the pair is formed by immersing the substrate in a polyanion solution.

If the polymer is an insulating polymer, the polyanion electrolyte solution preferably comprises the structure of FIG. 2(a), and the polycation solution preferably comprises the structure of FIG. 2(b).

If the polymer is a semiconducting polymer, the polyanion electrolyte solution preferably comprises the structure of FIG. 2(c), and the polycation solution preferably comprises the structure of FIG. 2(d).

If the polymer is a conducting polymer, the polyanion electrolyte solution preferably comprises the non-protonated form of the structure of FIG. 2(e), and the polycation solution preferably comprises the structure of FIG. 2(f).

The co-operating sub-layers may, in an alternative example, interact by acceptor/donor interaction. Preferably such acceptor/donor interaction is provided by hydrogen bonding.

Hydrogen bonding techniques in general are discussed, for example, in W. B. Stockton and M. F. Rubiner, "Molecular-Level Processing of Conjugated Polymers. 4. Layer-by-Layer Manipulation of Polyaniline via Hydrogen-Bonding Interactions", Macromolecules, 1997, 30, 2717–2725.

Preferably each sub-layer of the co-operating pairs of sub-layers is between 0.3 and 2 nm thick, and preferably is 1 nm thick.

The at least one polymer layer preferably comprises a plurality of pairs of sub-layers, for example two, four, or ten pairs.

The at least one polymer layer may alternatively comprise three or more co-operating sub-layers, each sub-layer being dissimilar to any other. The at least one polymer layer may comprise a plurality of the three or more sub-layers.

Preferably, the at least one polymer layer is between around 0.3 to 20 nm thick.

The organic material may be either a conjugated polymer, or a low molecular weight compound. The at least one layer of organic material may comprise a composite structure including at least one layer of a conjugated polymer and at least one layer of a low molecular weight compound.

If the at least one layer of organic material is a polymer then it is preferably a semiconductive conjugated polymer. The semiconductive conjugated polymer is preferably PPV or a derivative thereof.

The at least one layer of organic light-emissive material may be formed by any one of spin-coating, blade-coating, meniscus-coating, or dip-coating, The at least one layer of organic material preferably has a thickness in a range of about 30 nm to 1000 nm, and preferably of about 90 nm.

The method may further comprise the step of, prior to the step of forming the at least one polymer layer, removing physisorbed water from the surface of the substrate. The step of removing the physisorbed water from the surface preferably comprises heating the substrate.

The method may further comprise the step of, prior to the step of forming the at least one polymer layer, forming a coupling layer. The step of forming the coupling layer preferably comprises silylating the substrate. If the step of removing the physisorbed water is performed, then the step of forming the coupling layer is performed thereafter.

The substrate may have a pH dependent surface charge, and the method may further comprise preparing the surface of the substrate prior to self-assembly by making the surface charge pH independent.

The method may further comprise preparing the surface of the substrate prior to self-assembly, wherein the surface comprises amino groups, the method comprising the step of quaternising the amino groups. The quaternised surface is positively charged.

The method may further comprise preparing the surface of the substrate prior to self-assembly, wherein the surface comprises thiol groups, the method comprising the step of oxidising the thiol groups. The oxidised surface is negatively charged.

The starting substrate, prior to formation of the first electrode, may comprise one of a glass or plastic material. The substrate may comprise any one of polyester, polycarbonate, polyimide, or poly-ether-imide.

The method may further comprise the step of forming a layer of conductive material over the second electrode. The conductive material preferably comprises aluminium or an alloy thereof. The conductive material may be sputter deposited, preferably by DC magnetron or RF sputtering, or evaporated, preferably by resistive or electron-beam thermal evaporation.

The first electrode may be a cathode and the second electrode an anode, or the first electrode may be an anode and the second electrode a cathode.

The cathode may comprise a light-transmissive conductive oxide, preferably indium-tin-oxide, tin oxide, or zinc oxide. The cathode may be sputter deposited or evaporated.

The anode may comprise a light-transmissive conductive oxide, preferably indium-tin-oxide, tin oxide, or zinc oxide. The anode may be sputter deposited or evaporated.

The first aspect of the present invention also provides an organic light-emitting device comprising: at least one layer of organic light-emissive material between a first electrode and a second electrode, the at least one organic light-emissive material having been formed other than by self-assembly; and at least one polymer layer between one of the first and second electrodes and the at least one organic light-emissive material, the at least one polymer layer being formed by self-assembly.

Preferably, the at least one polymer layer comprises at least one pair of co-operating sub-layers, and the at least one layer of organic material is a continuous layer having a consistent composition throughout.

The at least one polymer layer preferably comprises a plurality of pairs of co-operating layers.

In a preferential embodiment of the present invention the technique of self-assembly of polyelectrolytes is used to deposit thin, well-defined layers of insulating, semiconducting, or conducting polymers between a—preferably ITO—electrode and an emissive polymer in polymer LEDs. In this technique, a substrate is dipped alternately into polycation and polyanion solutions, depositing alternate layers by electrostatic attraction. The self-assembly technique deposits only a thin interfacial layer; the rest of the device is deposited, preferably, by spin coating. This gives a significant reduction in processing time compared with prior art devices made entirely by self-assembly.

Since each self-assembled layer is thin and contiguous, well-defined structures can be built up in accordance with this aspect of the present invention with control of thickness of the interfacial layer in the nanometer regime. The present invention also provides the optimum materials and thickness for these interfacial layers in order to optimise the quantum and power efficiencies of polymer LEDs. Significantly enhanced power efficiencies and significantly enhanced maximum brightnesses are achieved by the use of the present invention.

The self-assembly process preferably requires a starting surface with a well-defined surface charge. This is typically achieved by forming a coupling layer on the surface prior to self-assembly, typically by surface treatment with a silylating agent.

It is a second object of the present invention to provide an improved starting surface for a self-assembly process in fabricating an organic LED or a part thereof.

In a second aspect of the present invention there is provided a method of fabricating an organic light-emitting device, comprising the steps of: forming a first electrode for the device over,;a substrate; removing physisorbed water from the surface of the first electrode; forming a coupling layer; forming, by self-assembly, at least one polymer layer over the first electrode; forming at least one layer of organic light emissive material over, the at least one polymer layer; and forming a second electrode for the device over the at least one layer of light emissive material.

The step of forming this coupling layer preferably comprises silylating the substrate.

The second aspect of the present invention also provides a method of fabricating an organic light-emitting device, comprising the steps of: forming a first electrode for the device over a substrate; forming at least one layer of organic light emissive material over the first electrode; removing physisorbed water from the surface of the at least one organic light-emissive material; forming a coupling layer; forming, by self-assembly, at least one polymer layer over the at least one layer of light emissive material; and forming a second electrode for the device over the at least one polymer layer.

The removal of physisorbed water, preferably by heating of the ITO substrate in vacuum, from the surface prior to surface silylisation and LED production, results in the production of a well-defined surface prior to self-assembly, and consequently improved control of interfacial layer quality. This second aspect of the invention also provides a reduction in device degradation by removal of water close to the interfacial layer. Without the removal of the physisorbed water, the coupling layer may form a gel when deposited, floating on the surface. Thus this second aspect of the invention provides an improvement in the bonding of the coupling layer to the electrode.

It is a third object of the present invention to provide an improved starting surface for a self-assembly process, such that the implementation of the self-assembly process is versatile.

According to a third aspect of the present invention there is provided a method of preparing a surface having a pH dependent surface charge prior to self-assembly comprising the step of making the surface charge pH independent. The surface is preferably of a substrate of a light-emitting device. The light-emitting device is preferably an organic light-emitting device.

The third aspect of the present invention also provides a method of preparing a surface comprising amino groups prior to self-assembly comprising the step of quaternising the amino groups. The surface is preferably of a substrate of a light-emitting device. The light-emitting device is preferably an organic light-emitting device. The quaternised surface is positively charged.

The third aspect of the present invention further provides a method of preparing a surface comprising thiol groups prior to self-assembly comprising the step of oxidising the thiol groups. The surface is preferably of a substrate of a light-emitting device. The light-emitting device is preferably an organic light-emitting device. The oxidised surface is negatively charged. After oxidation, the surface is preferably deprotonated with an alkali.

Many polyions are only stable at certain pH values, so the quaternisation and oxidation steps respectively allow a wider range of polyions to be deposited in LED structures than was previously possible without changing the coupling agent. This allows a range of polycations and polyanions (which require different pH values to be stable as ions in solution) to be self-assembled using the same coupling agent.

Quaternisation and oxidation techniques are described, for example, in J. March, "Advanced Organic Chemistry: Reactions, Mechanisms and Structure", 3rd Ed., John Wiley & Sons, New York, 1985, Chapters 10 and 19.

As a result of either the quaternisation or the oxidation processes according to the third aspect of the invention, the resultant coupling agents advantageously have greatly reduced susceptibility to oxidation, a process that can be a problem in devices.

The invention will now be described with reference to the accompanying drawings in which.

Figure 17:
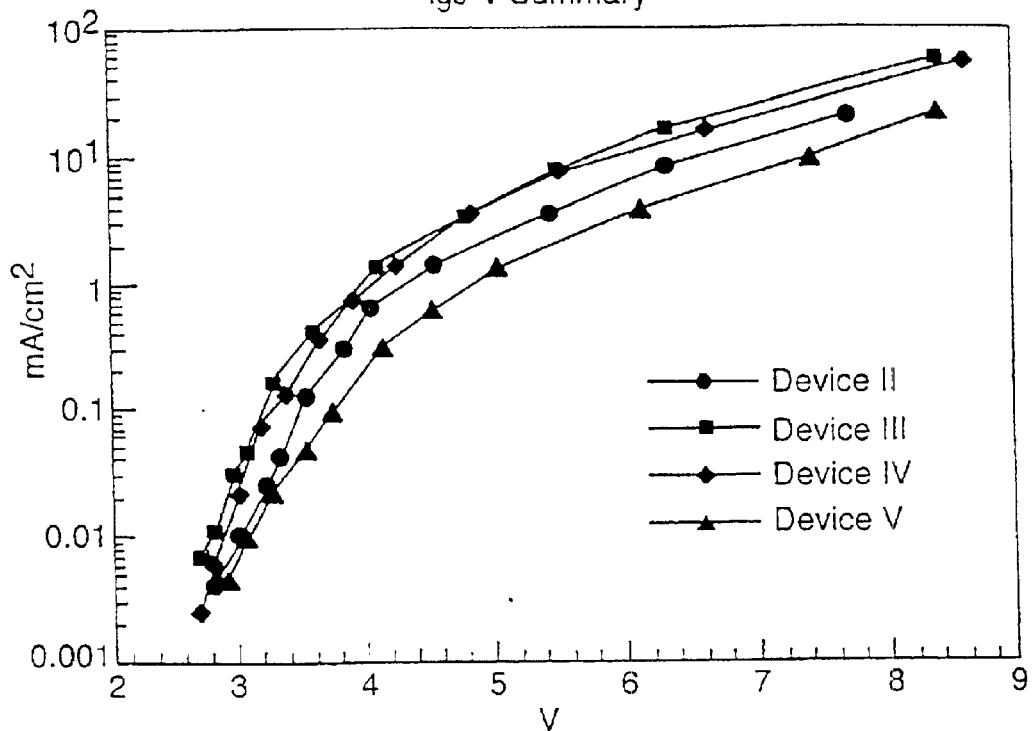
Figure 18:
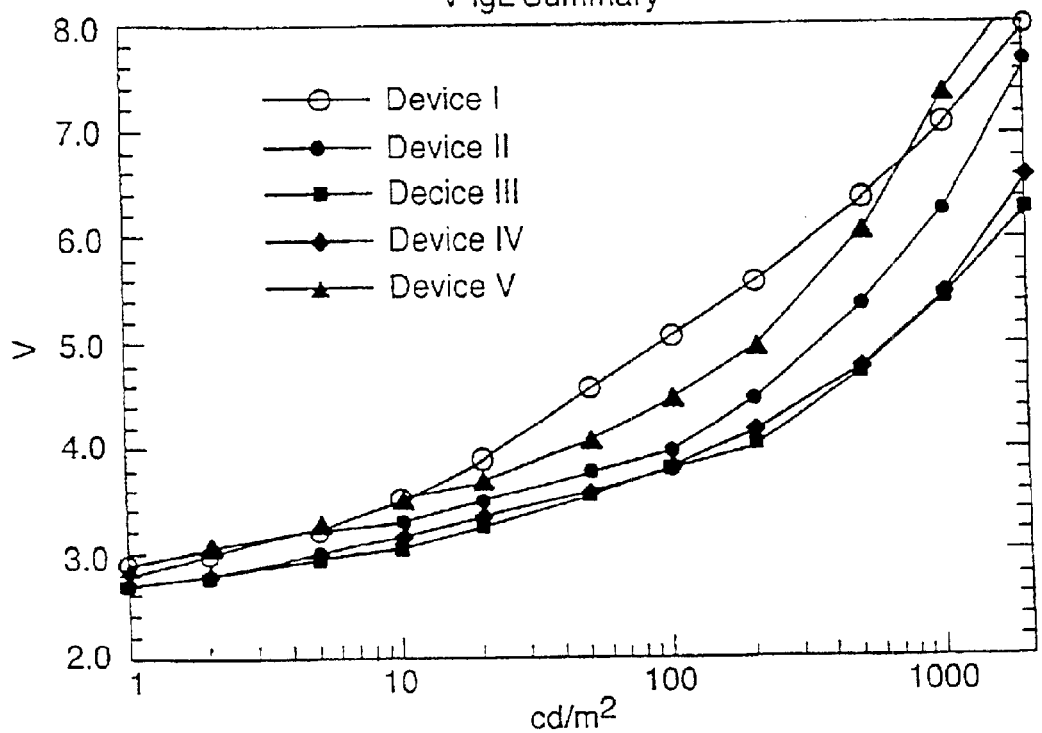
Figure 19:
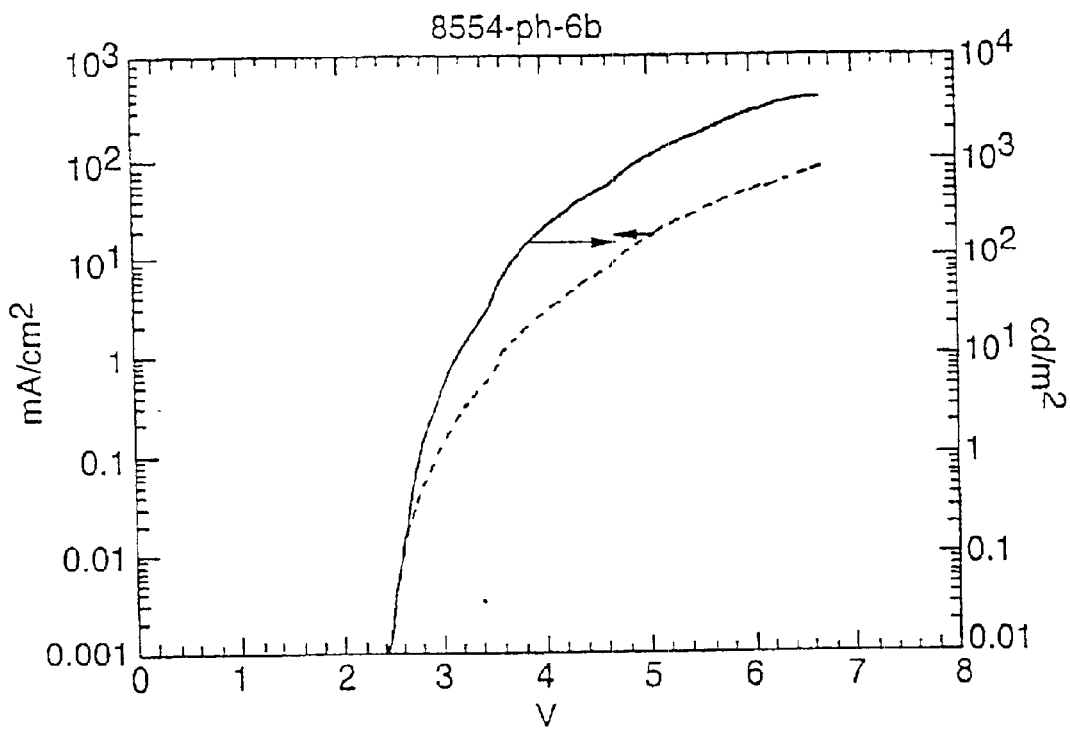
Figure 19:
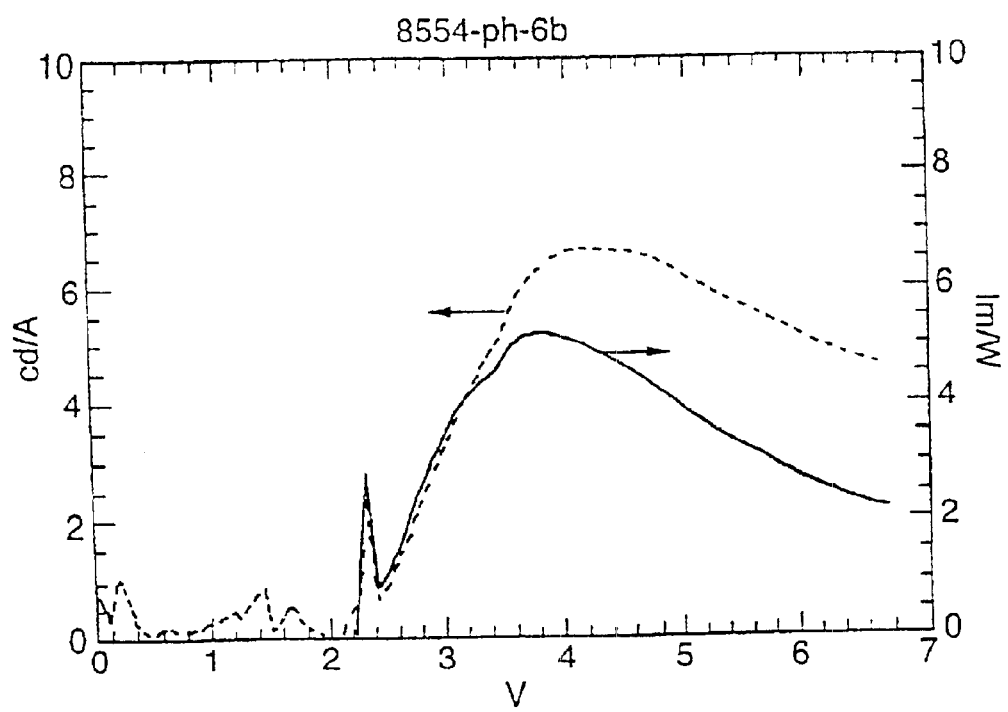
Figure 20:
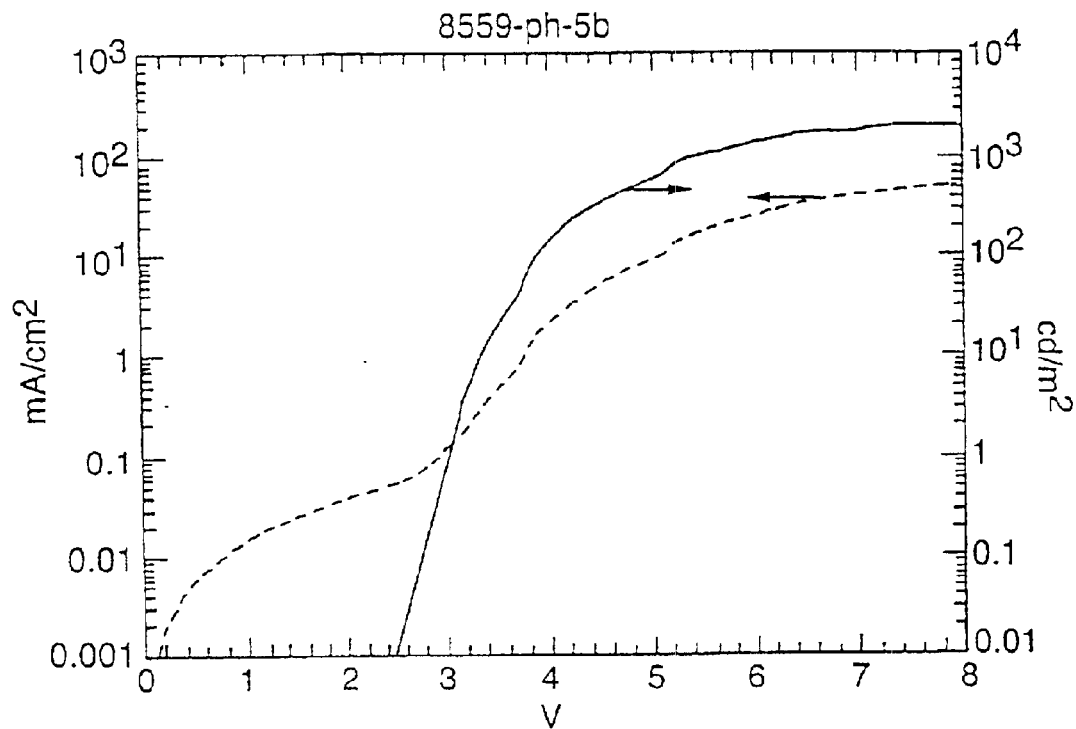
Figure 20:
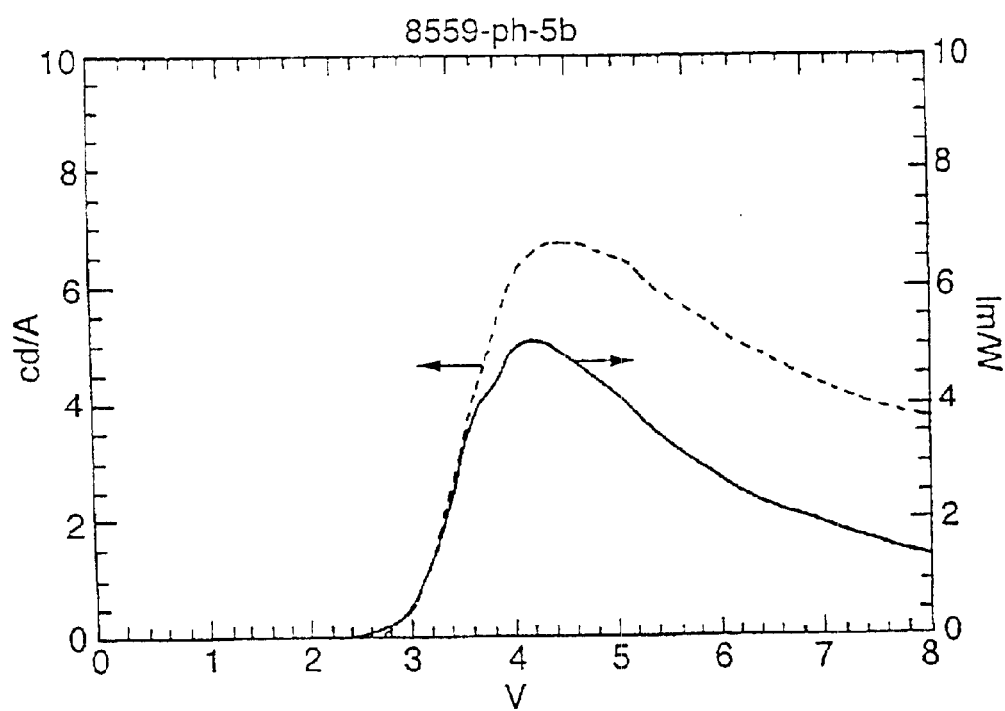

FIG. 17 plots the current density through devices I–V against applied voltage;

FIG. 18 plots the drive voltage for devices I–V against brightness;

FIG. 19 shows the representative performance of device X;

FIG. 20 shows the representative performance of device Y; and

Figure 21:
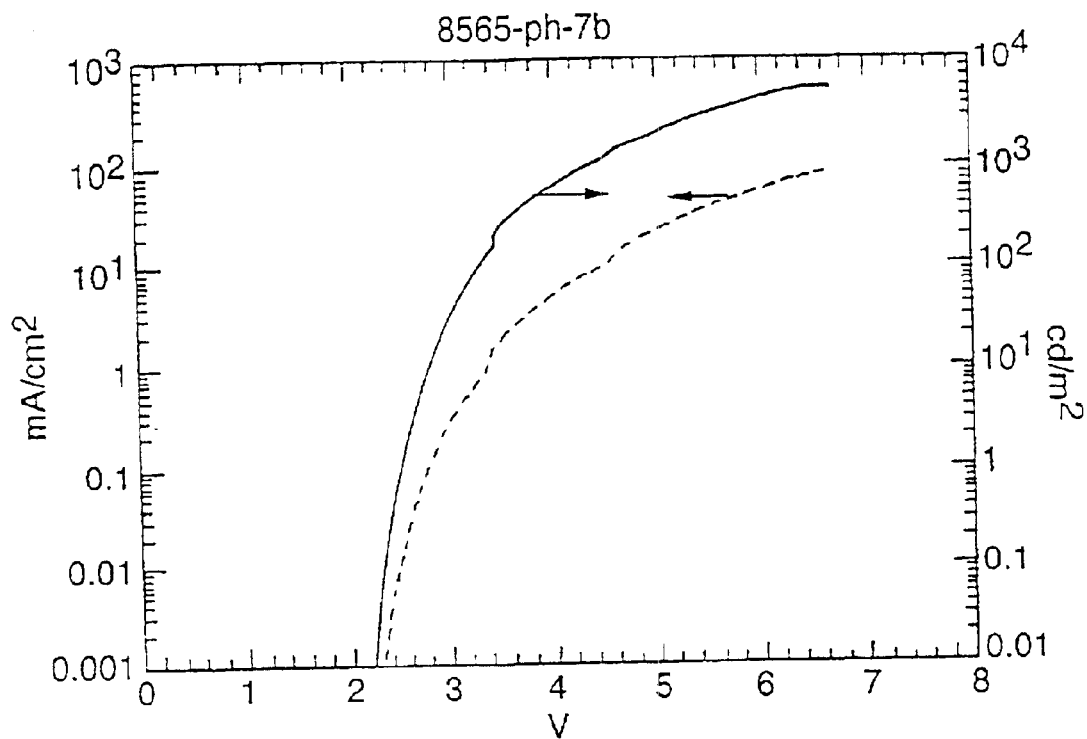
Figure 21:
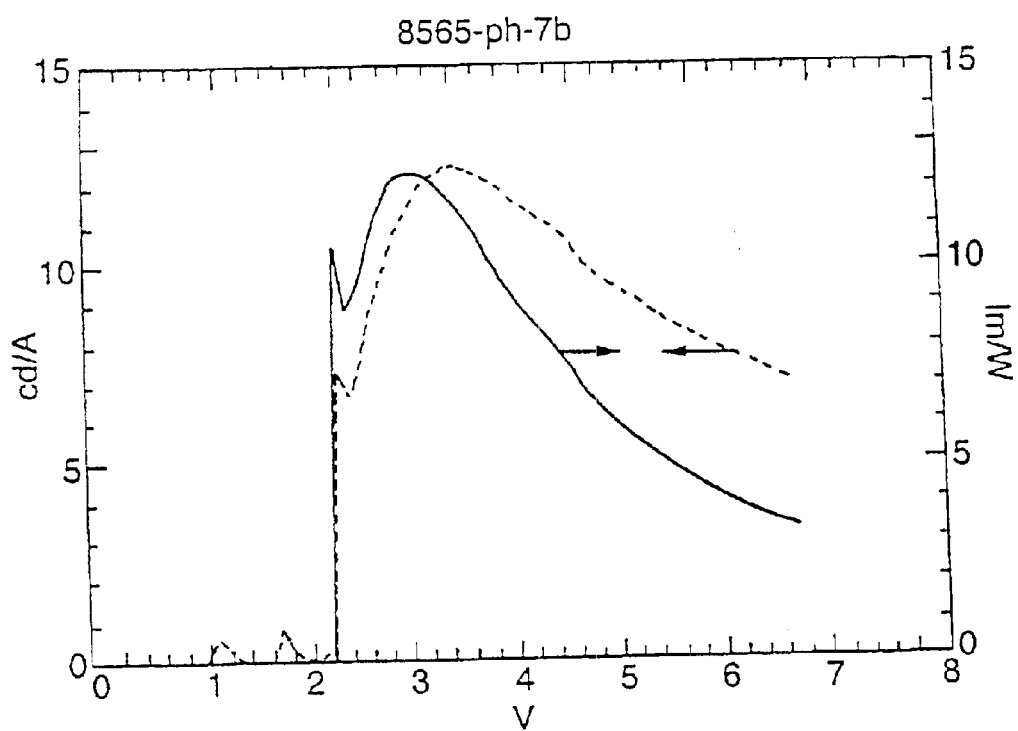

FIG. 21 shows a representative performance of device Z.

In a first example, a device is fabricated on a commercial 1×1 $cm^2$ ITO (indium-tin-oxide)-glass substrate (Balzers).

Figure 1:
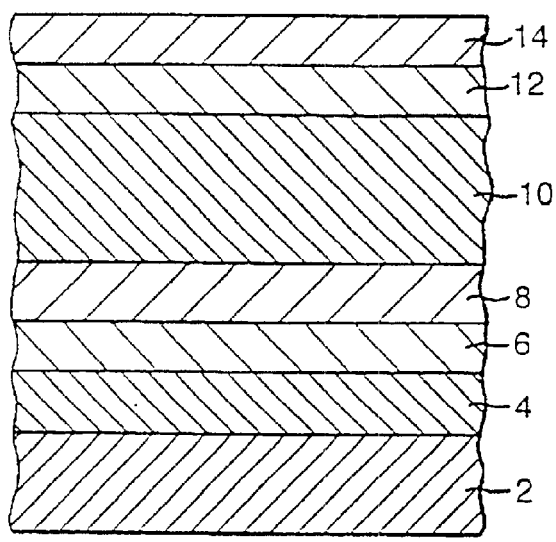
FIG. 1 illustrates an OLED fabricated in accordance with the present invention.

Referring to FIG. 1, such an exemplary substrate is shown in which an ITO layer 4 is formed on a glass substrate 2. For all chemical treatment steps in this first example, the substrate is held in a vertical configuration on PTFE substrate-holders. The solvents used in this example are of HPLC grade or better, unless otherwise noted. Reagents used are of AR grade or better.

In a first step, the ITO layer is patterned and cleaned, The ITO surface is selectively coated with a commercial photoresist and then baked at 45° C. for 10 minutes in an oven. The exposed areas are etched off in 200 ml 5 wt % HCl at 60–65° C. for 45 min. The photoresist is then stripped off in 2×100 ml acetone.

The patterned ITO substrate is then cleaned using an RCA recipe (10:2:0.6 $H_2O$—$H_2O_2$—$NH_3$, 200 ml), mildy-agitated at 55–60° C., for 75 minutes.

In a second step a coupling layer, shown in FIG. 1 as a layer 6, is formed in preparation for the layer-by-layer self-assembly. Preferably and advantageously, the substrate is heated in a dynamic vacuum to 165–170° C. for 2–3 hours in a vacuum oven to remove physisorbed $H_2O$ prior to surface silylisation.

The substrate is then cooled in air briefly to 100° C., and then immersed in a 200-mL toluene bath containing 5 vol % 3-aminopropyltrimethoxysilane. The reaction bath was warmed to 95–97° C. for 2 hours, taking care to exclude moisture. This gives an ITO surface functionalised with amino (—$NH_2$) groups tethered to the end of a short $C_3$ alkyl chain.

The silylised substrates are washed in 2×100 ml toluene and 1×MeOH in that order, and dried under a jet of $N_2$. Visual inspection of the specular reflection off the ITO surface at this point shows an optically-clear, homogenous surface with very few scattering particles on a pinhole-free ITO film.

The amino groups are then preferably, and advantageously, quaternised to the pH-insensitive trimethylammonium (—$NMe_3^+$) moiety, and to achieve this the substrate is immersed in 200 mL N,N-dimethylformamide containing 5 vol % $CH_3I$ and 0.6 vol % $Et_3N$ for 3 hours. The reaction bath is kept in the dark at room temperature (24° C.).

The quaternised substrate is washed in 2×100 ml MeOH, 1×100 ml 0.45-$\mu$m filtered $H_2O$, and then 1×100 ml 0.45-$\mu$m filtered IPA in that order and blown dry in a jet of $N_2$. Visual inspection at this point shows the surface to remain optically-clear and homogenous.

In a third step the interfacial layer, denoted in FIG. 1 by layer 8, is constructed using layer-by-layer self-assembly.

The self-assembly fabrication steps may be performed by any number of self-assembly techniques. In one alternative the attractive forces by which the pairs of co-operating sub-layers interact is provided by an acceptor/donor interaction, and specifically by hydrogen bonding.

In the preferred technique used in relation to the examples described herein, the attractive forces by which the pairs of co-operating sub-layers interact is provided using oppositely charged layers for respective ones of the sub-layers of each pair.

In the first example, the layer-by-layer self-assembly third step is performed on the derivatised ITO-substrates in a laminar flow cabinet at room temperature.

Each assembly cycle assembles a bilayer, that is a pair of co-operating sub-layers, and consists of the following steps:

(i) Immersion in a polyanion electrolyte bath (static) for 14 min;
(ii) Rinsing in a fresh $H_2O$ (Millipore) bath (mildly agitated) for 10 s;
(iii) Immersion in a polycation bath (static) for 14 min;
(iv) Rinsing in a fresh $H_2O$ (millipore) bath (mildly agitated) for 10 s.

The assembled films are preferably not allowed to dry out between sequential steps. Carryover and cross-contamination of solutions were minimised by careful handling and rinsing.

The polyanion electrolyte bath, in this example where the interfacial layer is an insulating polymer, contains 20 ml $H_2O$ (Millipore), 21 mg of poly(styrene sulfonic acid, Na salt) (Aldrich, MW 70 k), 30 mg NaCl and ac HCl to adjust the pH to ca. 3. The polycation bath, in this example in which the interfacial layer is an insulating polymer, contains 20 ml $H_2O$ (Millipore), 8 mg of poly(allylamine hydrochloride) (Aldrich, MW 50–65 k), 30 mg NaCl and aq HCl to adjust the pH to ca. 3. After the self-assembly steps (i) to (iv), the bi-layer has one sub-layer of the structure of FIG. 2(a), and one sub-layer of the structure of FIG. 2(b).

In a first exemplification of this first example the steps (i) to (iv) were performed twice to assemble a structure having two bilayers, or two pairs of sub-layers.

The substrate is then rinsed in 2×40 ml $H_2O$ (Millipore) for 2 minutes. The substrate is then dried under dynamic vacuum for 5 hours.

The quaternisation step of the third step is advantageous since it results in a positively charged surface, such that the surface may then be immersed in either a basic solution or an acid solution during self-assembly. Quaternisation makes the surface charge of such a described device pH independent, thereby enabling use of the basic or acid solution.

In an alternative, the ITO surface is functionalised with thiol groups, and a different step is needed to make such surface pH independent. In this alternative, in the second step the coupling layer, shown in FIG. 1 as the layer 6, is again formed in preparation for the layer-by-layer self-assembly. The substrate is again heated in a dynamic vacuum to 165–170° C. for 2–3 hours in a vacuum oven to remove physisorbed $H_2O$ prior to surface silylisation.

The substrate is then again cooled in air briefly to 100° C., and then immersed in a 200-mL toluene bath containing 5 vol % 3-mercaptopropyltrimethoxysilane. The reaction bath was warmed to 95–97° C. for 2 hours, taking care to exclude moisture. This gives an ITO surface functionalised with thiol (—SH) groups tethered to the end of a short $C_3$ alkyl chain.

The silylised substrates are washed in 2×100 ml toluene and 1×MeOH in that order, and dried under a jet of $N_2$. Visual inspection of the specular reflection off the ITO surface at this point shows an optically-clear, homogenous surface with very few scattering particles on a pinhole-free ITO film.

The thiol groups are then, in this alternative second step, preferably and advantageously oxidised to the pH-insensitive sulfonate (—$S_3$) moiety, and to achieve this the substrate is immersed in 200 mL $H_2O$ containing 10 ml HCOOH and 30 ml $H_2O_2$ for 30 minutes at room temperature (24° C.).

The oxidised substrate is washed in 2×100 ml $H_2O$, 1×100 ml dilute NaOH (0.02M), 2×100 mL 0.45 $\mu$m-filtered $H_2O$, and then 1×100 ml 0.45-$\mu$m filtered iso-propyl alcohol (IPA) in that order and blown dry in a jet of N2. Visual inspection at this point shows the surface to remain optically-clear and homogenous.

In this alternative further, the third step is varied, although the interfacial layer, denoted in FIG. 1 by layer 8, is again constructed using layer-by-layer self-assembly of the interfacial layer. The assembly is performed on the derivatised ITO-substrates in a laminar flow cabinet at room temperature.

Each assembly cycle assembles a bilayer, that is a pair of co-operating sub-layer, and consists, in this alternative, of the following steps:

(i) Immersion in a polycation bath (static) for 14 min;
(ii) Rinsing in a fresh $H_2O$ (Millipore) bath (mildly agitated) for 10 s;
(iii) Immersion in a polyanion electrolyte bath (static) for 14 min;
(iv) Rinsing in a fresh $H_2O$ (Millipore) bath (mildly agitated) for 10 s.

The assembled films are preferably not allowed to dry out between sequential steps. Carryover and cross-contamination of solutions were minimised by careful handling and rinsing.

The polyanion electrolyte bath, in this alternative example where the interfacial layer is again an insulating polymer, again contains 20 ml $H_2O$ (Millipore), 21 mg of poly(styrene sulfonic acid, Na salt) (Aldrich, MW 70 k), 30 mg NaCl and aq HCl to adjust the pH to ca. 3. The polycation bath, in this alternative example in which the interfacial layer is again an insulating polymer, again contains 20 ml $H_2O$ (Millipore), 8 mg of poly(allylamine hydrochloride) (Aldrich, MW 50–65 k), 30 mg NaCl and aq HCl to adjust the pH to ca. 3. After the self-assembly steps (i) to (iv), the bi-layer again has one sub-layer of the structure of FIG. 2(a), and one sub-layer of the structure of FIG. 2(b).

In a fourth step an emissive MEH-PPV layer, shown in FIG. 1 as layer 10, is spin coated onto the device. 90-nm of poly(2-methoxy, 5-(2'-ethyl)-hexyloxy-p-phenylenevinylene) [MEH-PPV] is deposited on the substrate-polymer assembly by spin-coating of a 0.5 wt % $CHCl_3$ solution of the MEH-PPV at 2000 rpm for 1 min.

In a fifth step, the thus far constructed device is thermally treated. The semi-completed device is baked at 100° C. for 1 hour under dynamic vacuum (P<$10^{-4}$ mbar) to drive off free $H_2O$. The substrates are then slowly cooled to 50° C. over 2 hours, still in vacuo.

A sixth step is a metal electrode deposition step. Without breaking vacuum, a 200-nm thick Ca layer is thermally evaporated at a base pressure of $6\times10^{-6}$ mbar, through a mask, onto the MEH-PPV to give 4.4 $mm^2$ devices. A 100-nm thick Al layer is then finally evaporated to protect the Ca electrode.

Thus, a first example of an OLED according to the present invention is completed. As a control, for comparison with the advantageous performance characteristics achieved by the examples described herein implementing the concepts of the present invention, MEH-PPV is also spun directly on RCA-cleaned ITO. Devices prepared from the RCA-cleaned ITO are designated as "conventional devices" hereafter.

For the device according to the first example with the insulating polymer interfacial layer, a maximum efficiency of 0.92 cd/A at 7V is obtained, compared with 0.16 cd/A at 7V for the conventional device, representing an improvement by a factor of 5.8. The device according to the first example with the insulating polymer interfacial layer has a current density of 170 mA/$cm^2$, compared with 930 mA/$cm^2$ for the conventional device, representing a decrease by a factor of 5. The device according to the first example with the insulating polymer interfacial layer has a maximum power efficiency of 0.45 lm/W at 6V, compared with, 0.079 lm/W at 7V for the conventional device, representing an increase by a factor of 5.8. The device according to the first example with the insulating polymer interfacial layer has a maximum luminance of 2100 cd/$m^2$ at 8V, compared with 1300 cd/$m^2$ at 7V for the conventional device, representing an increase by a factor of 1.6.

Figure 3:
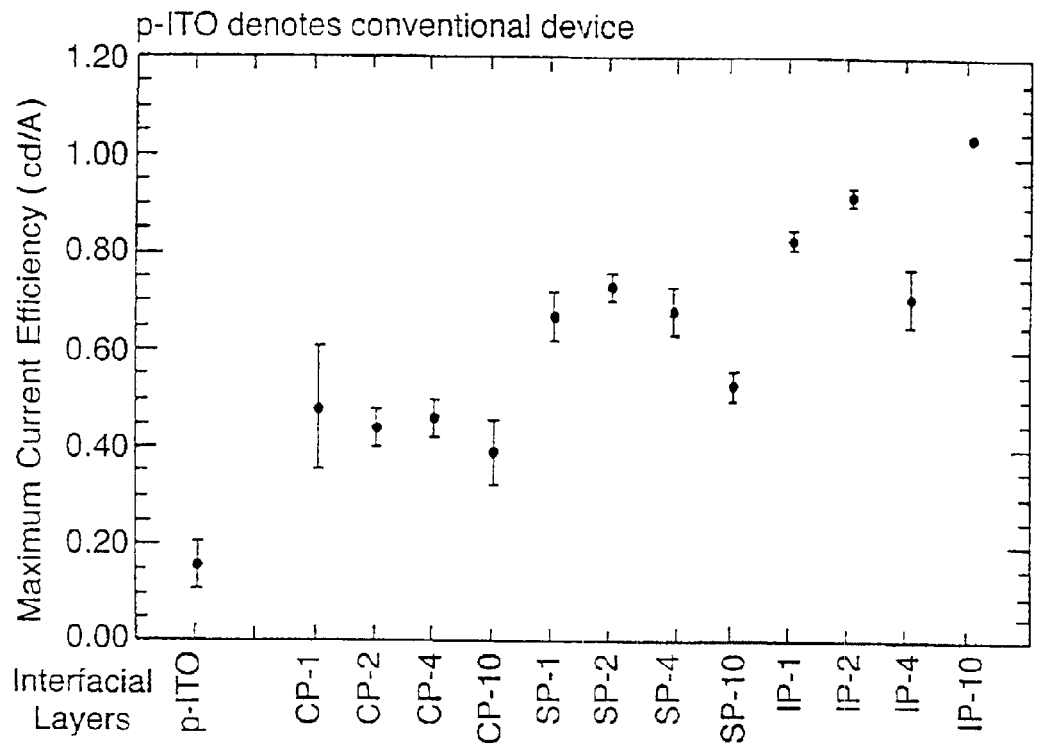
FIG. 3 illustrates the efficiency obtained by described examples of devices according to the present invention.
Figure 4:
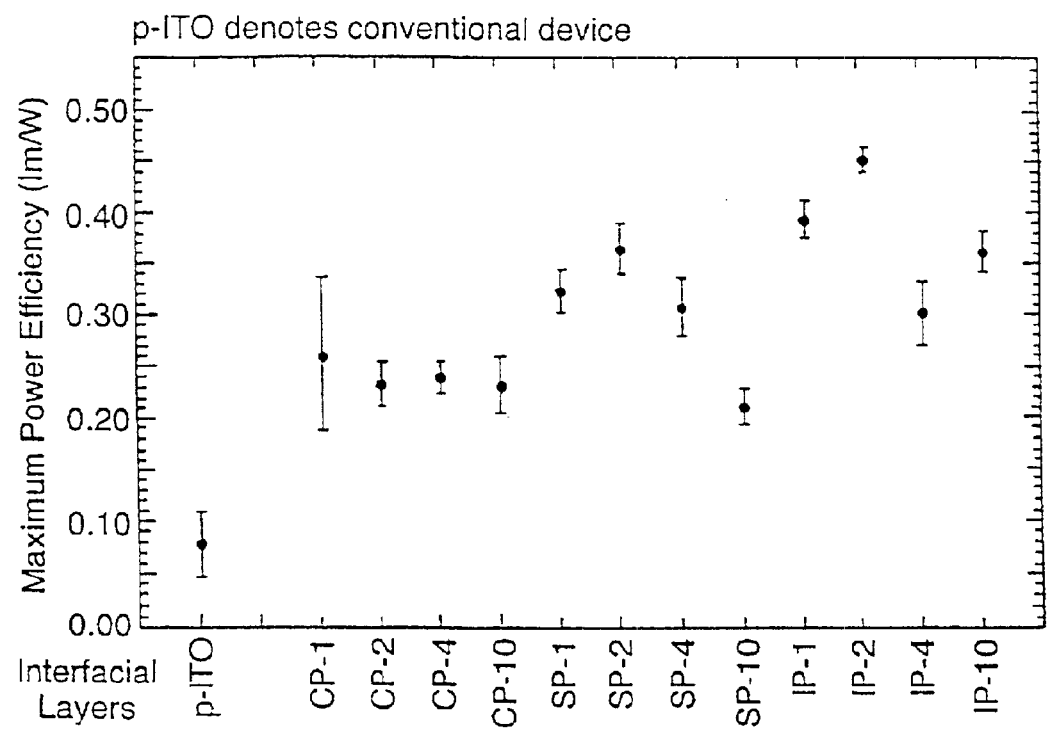
FIG. 4 illustrates the power efficiency obtained by described examples of devices according to the present invention.
Figure 5:
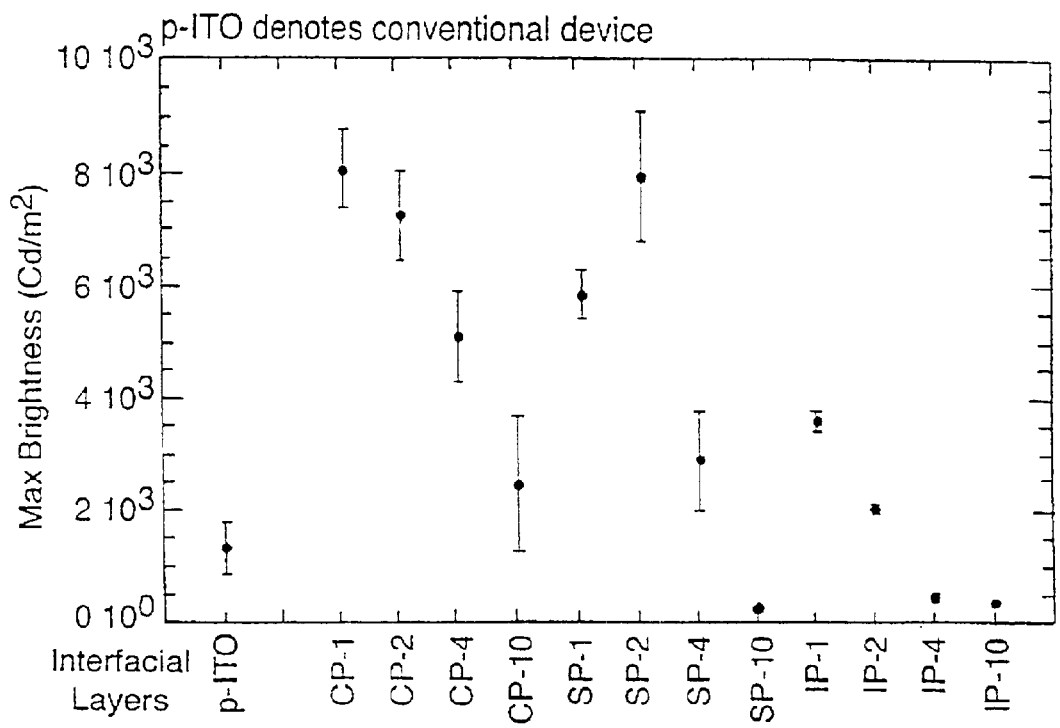
FIG. 5 illustrates the luminance obtained by described examples of devices according to the present invention.

To illustrate the advantageous performance of an OLED assembled according to the present invention, reference is now made to FIGS. 3, 4, and 5. FIGS. 3, 4, and 5 illustrate experimental results achieved by devices assembled according to the present invention against those results achieved with conventional devices. FIGS. 3, 4, and 5 illustrate efficiency, power efficiency, and luminance of the devices respectively.

Figure 2:
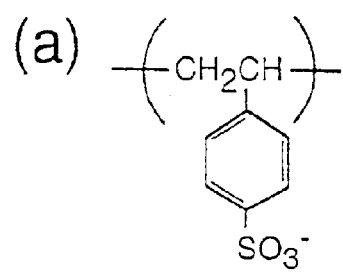
FIG. 2 illustrates examples of the composition of particular layers of the structure of FIG. 1.
Figure 2:
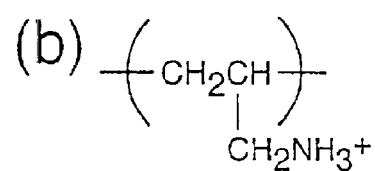
Figure 2:
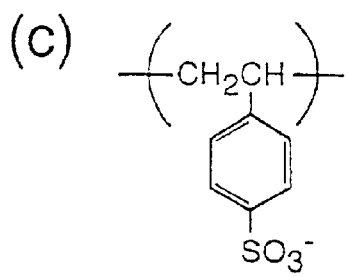
Figure 2:
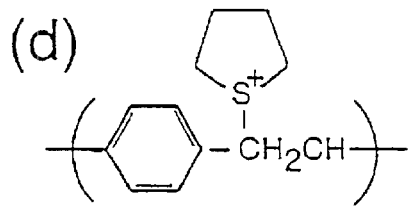
Figure 2:
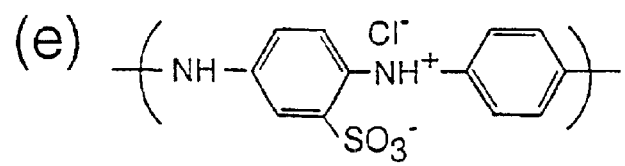
Figure 2:
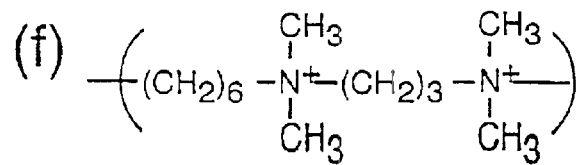

A number of devices are fabricated as described in the first example, except that the number of bilayers deposited in the third step is varied. Devices with 1, 2, 4 and 10 bilayers, or pairs of sub-layers, were assembled by performing the step (i) to (iv) once, twice, four times and ten times respectively. In FIGS. 2 to 4, points IP-1, IP-2, IP-4 and IP-10 represent the results for a device assembled according to the first example with 1, 2, 4 and 10 bilayers respectively. These results demonstrate that the power efficiency is optimised with two bilayers of the insulating polymer illustrated in FIGS. 2(a) and (b).

In a second example, devices are fabricated as described in the first example above, except that in the third step the polyanion bath contains 20 ml $H_2O$ (Millipore), 22 mg, of poly(styrene sulfonic acid, Na salt) (Aldrich, MW 70 k), 30 mg NaCl and aq HCl to adjust the pH to ca. 3; and the polycation bath contains 20 ml $H_2O$ (Millipore), 0.76 g of a 3.0 wt % MeOH solution of the tetrahydrothiophenium chloride precursor to poly(phenylene vinylene), 30 mg NaCl and aq HCl to adjust the pH to ca. 3. After the self-assembly steps (i) to (iv), the bi-layer again has one sub-layer of the structure of FIG. 2(c), and one sub-layer of the structure of FIG. 2(d). The fifth, thermal treatment step, is found to develop short conjugation lengths in the PPV-precursor polymer to give a semiconducting polymer.

For the device according to the second example with the semiconducting polymer interfacial layer, a maximum efficiency of 0.73 cd/A at 6.5V is obtained, representing an improvement by a factor of 4.6 compared with the conventional device. The device according to the second example with the semiconducting polymer interfacial layer has a current density of 970 mA/$cm^2$, similar to the conventional device. The device according to the second example with the semiconducting polymer interfacial layer has a maximum power efficiency of 0.364 lm/W at 6V, representing an increase by a factor of 4.6 compared with the conventional device. The device according to the second example with the semiconducting polymer interfacial layer has a maximum luminance of 7900 cd/$m^2$ at 7.5V, representing an increase by a factor of 6.0 compared with the conventional device.

In the second example a number of devices were fabricated as described in the first example above, except that the number of bilayers deposited in the third step was varied. Again, devices with 1, 2, 4 and 10 bilayers were formed. The values of efficiency, power efficiency and maximum luminance for these devices are shown in FIGS. 3, 4 and 5 respectively. In FIGS. 3 to 5, points SP-1, SP-2, SP-4 and SP-10 represent the results for a device assembled according to the second example for 1, 2, 4 and 10 bilayers respectively. These results demonstrate that the efficiency, power efficiency and maximum luminance are all optimised with two bilayers, or two pairs of sub-layers, of the semiconducting polymer of FIGS. 2(c) and (d).

In a third example a device is fabricated as described above in the first example, except that in the third step the polyanion bath contains 20 ml $H_2O$ (Millipore), 16 mg of sulfonated polyaniline, 30 mg NaCl and concentrated $NH_3$ to adjust the pH to ca. 11, and the polycation bath contains 20 ml $H_2O$ (Millipore), 17 mg of hexadimethrine bromide (Aldrich), 30 mg NaCl and concd $NH_3$ to adjust the pH to ca. 11. After deposition of the interfacial layer, the substrate is briefly immersed in a 0.2 M HCl solution to protonate the interfacial layer, giving the conducting form of polyaniline. Thus the third example assembles a structure in which the interfacial polymer layer is a conducting polymer, the bi-layer having one sub-layer of the structure of FIG. 2(e), and one sub-layer of the structure of FIG. 2(f).

The device assembled according to the third example with the conducting polymer interfacial layer has a maximum efficiency of 0.44 cd/A at 6.5V, representing an improvement by a factor of 2.8 compared with the conventional device.

The device assembled according to the third example with the conducting polymer interfacial layer has a current density of 1430 mA/cm$^2$, representing an increase by a factor of 1.5 compared with the conventional device. The device assembled according to the third example with the conducting polymer interfacial layer has a maximum power efficiency of 0.23 lm/W at 6V, representing an increase by a factor of 3.0 compared with the conventional device. The device according to the third example with the conducting polymer interfacial layer has a maximum luminance of 7300 cd/m$^2$ at 7V, representing an increase by a factor of 5.6 compared with the conventional device.

A number of devices are fabricated as described in the first example, except that the number of bilayers deposited in the third step is again varied. Again, devices with 1, 2, 4 and 10 bilayers, or pairs of sub-layers, are used. In FIGS. 3 to 5, points Cp-1, CP-2, CP-4 and CP-10 represent the results for a device assembled according to the third example for 1, 2, 4 and 10 bilayers respectively. These results demonstrate that the efficiency and power efficiency and maximum luminance are all improved compared with the conventional device. The efficiency and the power efficiency are relatively insensitive to the number of bilayers of the conducting polymer of FIGS. 2(e) and (f) in the range 1 to 10, however the maximum luminance is optimised with thin interfacial layers due to the increase in current density at a given drive voltage for thin interfacial layers.

A method including grading the properties of the polymer layer through its thickness will now be described.

Figure 6:
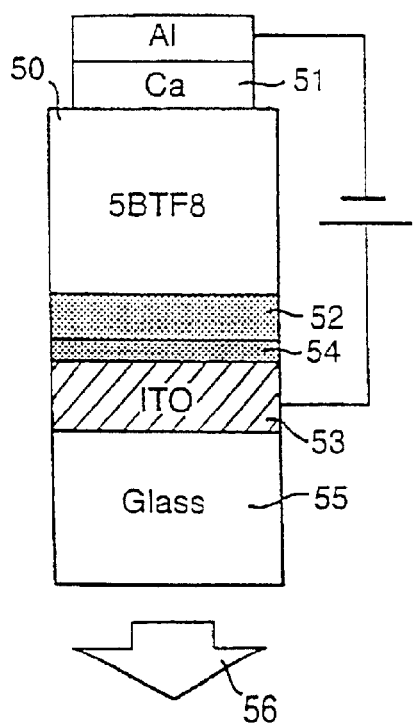
FIG. 6 is a schematic cross-sectional view of a device having 5BTF8 (F8 doped with 5% F8BT) as the emitting material.
Figure 8:
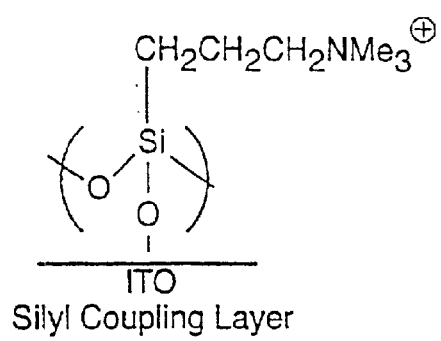
FIG. 8 shows the chemical structure of a silyl coupling layer.
Figure 7:
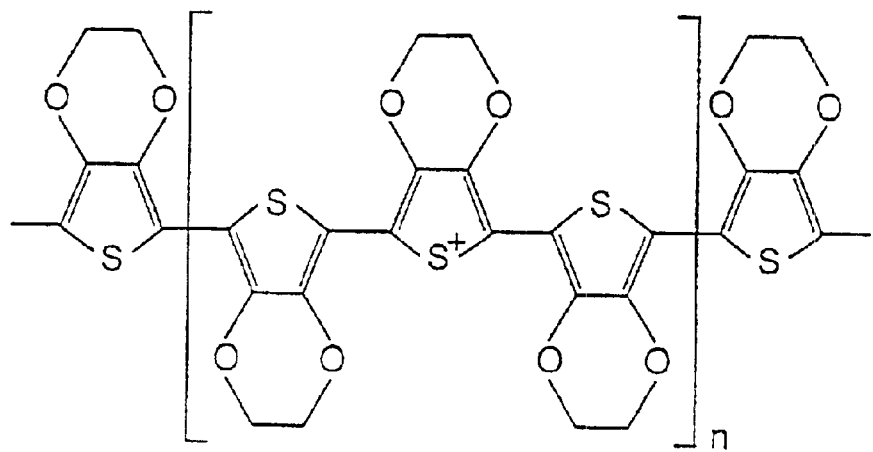
FIG. 7 shows the chemical structures of poly (styrenesulphonic acid) doped poly (ethylenedioxythiophene) (PEDOT-PSS), poly(2,7-(9,9-di-n-octylfluorene)) (F8), and poly(2,7-(9,9-di-n-octylfluorene)-3,6-benzothiadiazole) (F8BT)
Figure 7:
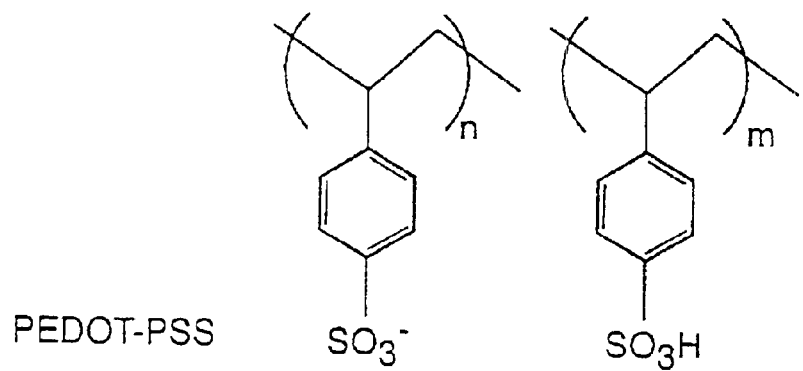
Figure 7:
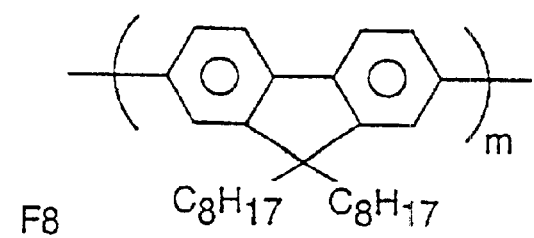
Figure 7:
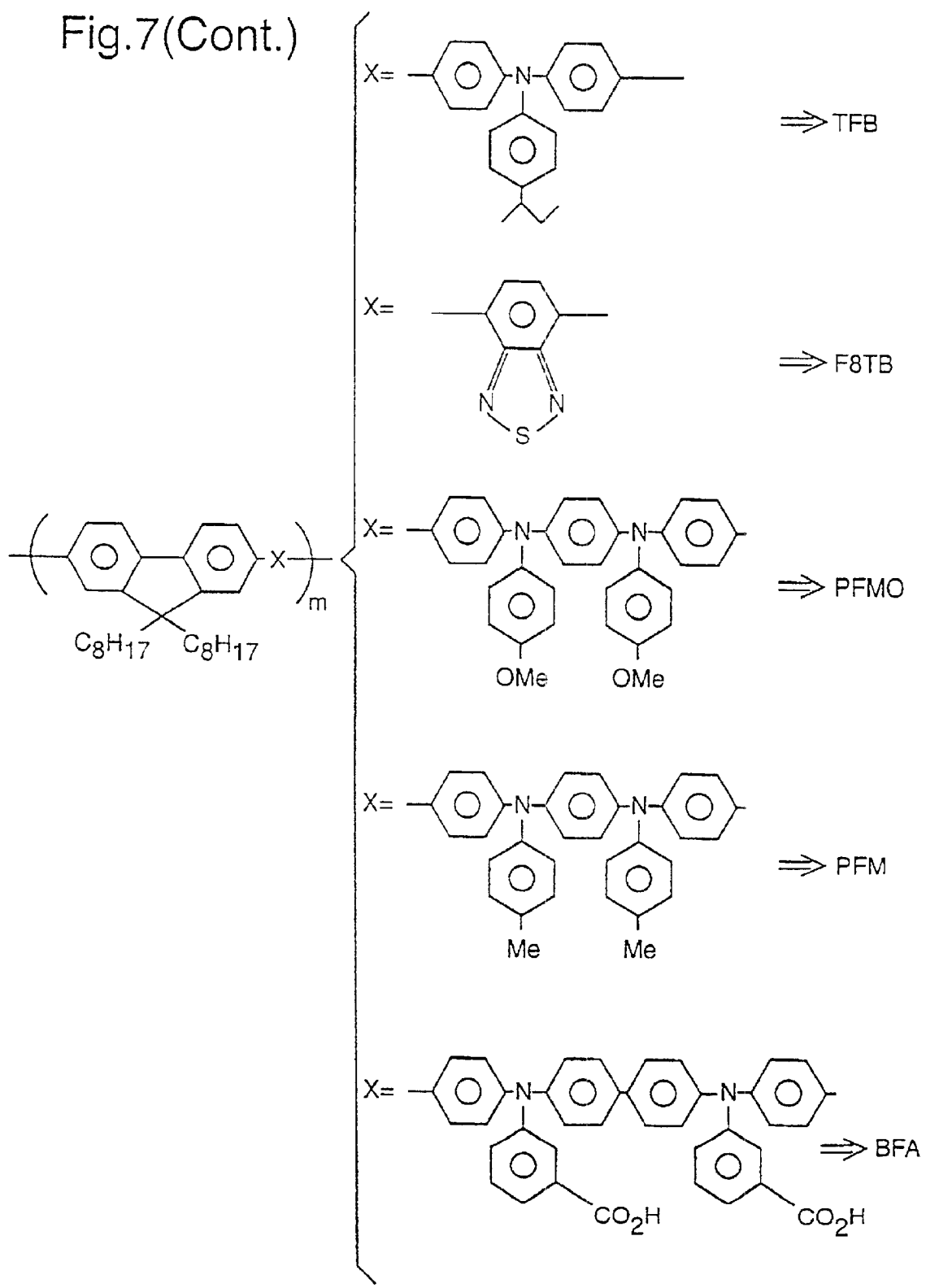

This example describes the fabrication of an organic light emissive device (OLED) (illustrated schematically in cross-section in FIG. 6) comprising the 5BTF8 blend (see also FIG. 7) as the emitting material 50; a calcium-aluminium cathode 51; and, an interlayer based on PEDOT:PSS and PPV next to the ITO anode 53. There is a silyl coupling layer 54 (see also FIG. 8) between the PEDOT:PSS/PPV 52 and the ITO 53. The device is formed on a glass substrate 55 and in operation light is emitted through the glass as shown generally by arrow 56 when a voltage is applied between the anode and the cathode.

A polyelectrolyte self-assembly process is employed to build the interlayer 52. This process is particularly attractive as a general versatile method to form an ultra-thin, continuous and conformal polymer multilayer film (preferably on appropriately-treated substrates) by the sequential adsorption (deposition) of one polyelectrolyte carrying a net charge of one sign and then another polyelectrolyte carrying a net charge of the other sign. A multilayer film can be formed by repeating a cycle of steps. Each assembly cycle consists of immersing the substrate in each of the two polyelectrolyte solutions in turn, to deposit a pair of successive sub-layers from the solutions, with extensive rinsing steps in between. Each assembly cycle thus assembles one bilayer of the mutilayer film.

The process to be described below offers substantial enhancements over those reported in prior documents. Firstly, the present process permits the fabrication of an interlayer rather than the whole emitting layer; this allows a degree of independent control that has not previously been possible. Secondly, the present process aims towards a gradation in the composition/property(ies) of the interlayer in the growth direction, and this gradation can be specially engineered to achieve significant improvement in LED performance.

An appropriately-treated ITO surface was prepared in this example by surface silylation with 3-aminopropyltrimethoxysilane. The polyelectrolyte self-assembly was carried out under dust-free conditions in a laminar flow cabinet. Commercially available p-doped PEDOT:PSS (available from Bayer AG) serves as the polyanion. This material comprises closely-associated PEDOT and PSS polymer pairs, with the ratio of negatively-charged sulfonate groups (on PSS) to the positively-charged thiophene rings (on PEDOT) approximately 3, so that the polymer pair is overall negatively-charged. For its self-assembly partner, poly(p-xylylene tetrahydrothiophenium chloride) (PPV-THT) was used. This polymer eliminates tetrahydrothiophene and hydrochloric acid at elevated temperatures to give conjugated p-phenylenevinylene (PPV) sequences that could advantageously support charge transport (here hole transport) and injection in one direction through a deposited layer but impede electron-leakage in the opposite direction through the layer and/or one or both of its interfaces with adjacent layers. The device is then completed by depositing a 5BTF8 emitting polymer layer of thickness 860 Å by spin-coating, and then a calcium cathode of thickness 2000 Å and an aluminium capping layer of thickness 1000 Å by thermal evaporation.

Several different types of devices were made to exemplify the invention. Device I is a control device comprising a hole-transport layer of PEDOT:PSS of thickness 320 Å deposited directly on the ITO substrate by spin-coating, and with the emitter layer spun over the PEDOT:PSS. Device II comprises a six-bilayered film of PEDOT:PSS/PPV deposited on the silylated ITO substrate by polyelectrolyte self-assembly. 5BTF8 is then deposited over this interlayer film by spin-coating. The PEDOT in the interlayer is substantially fully doped (ie. highly conducting). Device III comprises a six-bilayered film of PEDOT:PSS/PPV but with the PEDOT doping-level progressively reduced during the assembly, so that the PEDOT in the ultimate bilayer is essentially undoped (i.e. poorly conducting). Device IV is built in the same way as device III except that an additional bilayer of polystyrenesulfonate/PPV is assembled as the capping layer over the PEDOT:PSS/PPV film. Device V is built similarly to device II except that the PEDOT is substantially undoped.

The PEDOT doping-level in the assembly solution is readily adjusted by controlled reaction with hydrazine, which reduces p-doped PEDOT with the formation innocuous $N_2$ as by-product. In this way, PEDOT with decreasing (or in general gradually varying) doping-level can be assembled into the interlayer film. To suppress the possible scrambling of the doping-level due to concurrent charge and ion-transport through the growing interlayer, a basic solution medium was employed throughout. In this medium, $NH_4^+$ ions instead of the more mobile $H^+$ ions maintain charge neutrality.

The manufacture of the five example devices (devices I–V) will now be described.

Processing Details for Devices I to V
(1) ITO Surface Derivatisation

The following procedure was adopted to prepare ITO surfaces with well-defined pH-insensitive and redox-inactive quaternary ammonium functionalities:

The ITO-coated glass substrates (10 Ω/square, Balzers) were first patterned, cleaned by an RCA recipe ($H_2O:H_2O_2:NH_3$, 10:2:0.6, 50–60° C., 30 min), then baked in vacuum (165–70° C., 150 min) to remove physisorbed water, and cooled under dry nitrogen in a glove-bag. While in the glove-bag, the substrates were treated in a silylating bath (95° C., 2 h) to form —$CH_2CH_2CH_2NH_2$ groups that tether to the ITO surface. The silylating bath (20 ml) consisted of 5 vol. % 3-aminopropyltrimethoxysilane (Aldrich) in HPLC-grade toluene (Aldrich) previously dried over 4 Å molecular sieves. The substrates were then washed in HPLC-grade toluene (1×50 ml), HPLC-grade methanol (2×50 ml) and HPLC-grade isopropanol (2×50 ml) in that order. Inspection by viewing under oblique illumination showed no sign of silica gel formation which would result if insufficient care was taken.

The substrates were subsequently treated in a methylating bath in the dark (25° C., 3 h) to quaternise —CH$_2$CH$_2$CH$_2$NH$_2$ to the pH-insensitive and redox-inactive propyltrimethylammonium ions (—CH$_2$CH$_2$CH$_2$NMe$_3$$^+$). The methylating bath (20 ml) consisted of 5 vol. % CH$_3$I (Aldrich) and 0.5 vol. % triethylamine as acid-scavenger in HPLC-grade N,N-dimethylformamide (Aldrich). The substrates were then washed in deionised H$_2$O (3×50 ml) and HPLC-grade isopropanol (1×50 ml), and dried in a drying cabinet at 50° C. Visual inspection at this stage showed that the derivatised ITO surface essentially remained clear.

Figure 9:
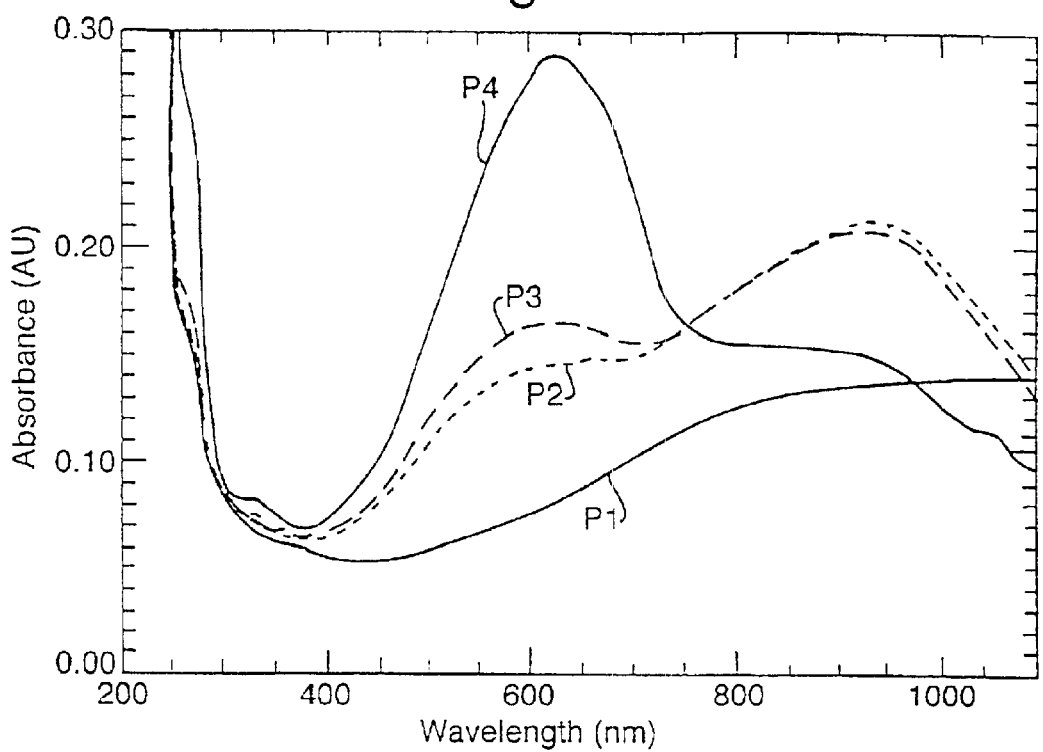
FIG. 9 shows UV-visible absorption spectroscopy measurements of the assembly solutions for devices I to IV.

(2) Preparation of the PEDOT:PSS Assembly Solution with Controlled PEDOT Doping-Levels Four solutions of PEDOT:PSS with decreasing level of doping (P1 to P4) were prepared from commercial material (Bayer AG's trial product A14071). 2.0 ml of the dark-blue solution of fully-doped PEDOT:PSS (1.6 w/v % total solids) was reacted with the following volumes of 55 w/v % hydrazine hydrate (Aldrich):

0.00 ml (none) to prepare material P1, 0.20 ml to prepare material P2, 1.0 ml to prepare material P3, 8.0 ml to prepare material P4;

each in a sealed amber vial together with enough distilled water to make up the total reaction volume to 10.0 ml. The reaction mixture was warmed to 70° C. for 3 h during which dedoping of PEDOT took place. The solutions were then allowed to stand overnight. No precipitation was observed. UV-vis absorption spectroscopy measurements of the resultant solutions (shown in FIG. 9) indicated success of the selective dedoping. The spectrum of the P1 solution is characteristic of fully-doped PEDOT (which is approximately 30%-doped), while that of the P4 solution is characteristic of undoped PEDOT (i.e. approximately 0%-doped) The spectra of P2 and P3 lie intermediate between the two, corresponding to about 25% and 20% respectively, as estimated from the corrected intensity of the n-n* transition at 620 nm. The dc conductivity measured by four-in-line probe on micron-thick films cast onto glass substrates is also consistent with decreasing levels of doping: 1.0 S/cm for P1, 0.01 S/cm for P2, 0.008 S/cm for P3 and 0.004 S/cm for P4.

To prepare the PEDOT:PSS assembly solutions, 9.5 ml of each of the resultant P1 to P4 solutions were mixed with 10 ml 50 mM aqueous NaCl to fix the final ionic strength at 25 mM, and the pH adjusted to 11 by addition of 50 µl 35 w/v % aqueous NH$_3$. This therefore gave approximately 0.15 w/v % total polymer solids in the assembly solutions. The NaCl solution was made with deionised water. The ionic strength of the solutions was kept at 25 mM to swamp out the influence of ionic impurities in commercial polyelectrolytes and provide a constant ionic background for the self-assembly.

(3) Preparation of the PPV-THT Assembly Solution

To prepare the PPV-THT assembly solution, 2.05 g of a poly(p-xylylene tetetrahydrothiophenium hydrochloride) solution in methanol (1.1 w/v % total solids, prepared according to standard literature procedures, see for example R. A. Wessling, "The polymerisation of xylylene bisdialkylsulfonium salts", Journal of Polymer Science Polymer Symposium 72, pp 55–66, 1985) was mixed with 18 ml 25 mM NaCl solution, and the pH was adjusted to 11 by addition of 50 µl 35 w/v % aqueous NH$_3$. The PPV-THT content in the assembly solution was therefore approximately 0.1 w/v %.

(4) Polyelectrolyte Self-Assembly

To form the interlayer film, polyelectrolyte self-assembly was performed at room temperature (22° C.) in a laminar flow cabinet within two hours after making up each polyelectrolyte solution.

(a) To assemble the one bilayer of the interlayer for device II, the derivatised ITO substrate was immersed in the P1 solution for 10 minutes, rinsed vigorously in 2×30 ml fresh deionised water for a total of 1 minute; then immersed in the PPV-THT solution for 10 minutes, and finally rinsed in 2×30 ml fresh deionised water for 1 minute. This cycle was repeated five more times to assemble the six-bilayered film of fully-doped PEDOT:PSS/PPV on the ITO anode.

(b) The first three bilayers of the interlayer in device III were fabricated following the protocol described above for device II. Then the PEDOT:PSS assembly solution was changed to P2 for the next assembly cycle, then to P3 and finally to P4. The idealised composition of the resulting polymer multilayer film was thus three bilayers of 30%-doped (fully-doped) PEDOT, followed by one bilayer of 25%-doped PEDOT, then one bilayer of 20%-doped P,DOT, and finally one bilayer of undoped PEDOT.

(c) The first six bilayers of the interlayer film in device IV were fabricated as described above for device III. After that, an additional assembly cycle in a polyanion solution of poly(styrenesulfonate, sodium salt) followed by a polycation solution of PPV-THT was used to assemble the capping layer of PSS/PPV over the PEDOT:PSS/PPV film. The poly(styrenesulfonate) solution was made by adding 24 mg of poly(styrenesulfonate, sodium salt) (molecular weight= 70,000; from Aldrich) to 20 ml 25 mM NaCl solution and pH adjusted to 11 by addition of 50 µl 35 w/v % aqueous NH$_3$.

At the completion of the assembly process, the substrates were transferred to a vacuum heating rig inside a glove-box and baked at 70° C. in a dynamic vacuum (pressure less than 10$^{-6}$ mbar) for 2 hours to drive off loosely bound water molecules from the self-assembled polyelectrolyte films and to effect a partial conversion of the PPV-THT to give short conjugated segments of oligo-p-phenylenevinylene sequences. Higher baking temperatures were found to give rise to considerable unproductive leakage currents during device operation at low voltages. The subsequent steps were all performed in the glove-box.

(5) Emissive Polymer and Metal Cathode Deposition

An 860 Å 5BTF8 film was deposited on top of the self-assembled polymer films by spin-coating at 1400 rpm from a 1.5 w/v % p-xylene solution. A 2000 Å calcium layer was thermally evaporated at 20 Å/s under a base pressure of 10$^{-6}$ mbar through a shadow mask to define eight 1.5 mm$^2$ (nominal) light-emitting diodes on each device substrate. A thin aluminium protective layer of thickness 100 Å was then evaporated over the calcium.

(6) Control Device

The bilayer control device I was fabricated by preparing an RCA-cleaned ITO substrate and spin-coating a 320 Å PEDOT:PSS film on to: it at a rate of 1850 rpm from a 0.8 w/v % aqueous solution. The film was then baked at 70° C. as described in part (4), after which an 860 Å 5BTF8 film, followed by a 2000 Å calcium layer and a 1000 Å aluminium protecting layer, were deposited as described in part (5).

To reduce scatter due to variations in the fabrication process, all five devices were fabricated in one batch.

FIGS. 10–14 show the representative performance of devices I–V respectively. The top panel of each figure gives the brightness of the device and also the current density through the device against applied voltage. The bottom panel of each figure gives the power efficiency and also the quantum efficiency of the device against applied voltage.

The following table summarises the drive voltage and power efficiency of the devices at selected brightnesses. The data was obtained by averaging over 3–4 of each type of device.

|  | Drive voltage for 10 cd/m² (V) | Power efficiency at 10 cd/m² (lm/W) | Drive voltage for 100 cd/m² (V) | Power efficiency at 100 cd/m² (lm/W) | Drive voltage for 1000 cd/m² (V) | Power efficiency at 1000 cd/m² (lm/W) |
|---|---|---|---|---|---|---|
| Device I | 3.5 | 0.6 | 5.1 | 1.1 | 7.1 | 2.6 |
| Device II | 3.3 | 23 | 4.0 | 12 | 6.3 | 6.0 |
| Device III | 3.1 | 20 | 3.8 | 12 | 5.5 | 8.0 |
| Device IV | 3.1 | 17 | 3.8 | 11 | 5.5 | 8.0 |
| Device V | 3.4 | 21 | 4.5 | 12 | 7.3 | 4.5 |

Figure 15:
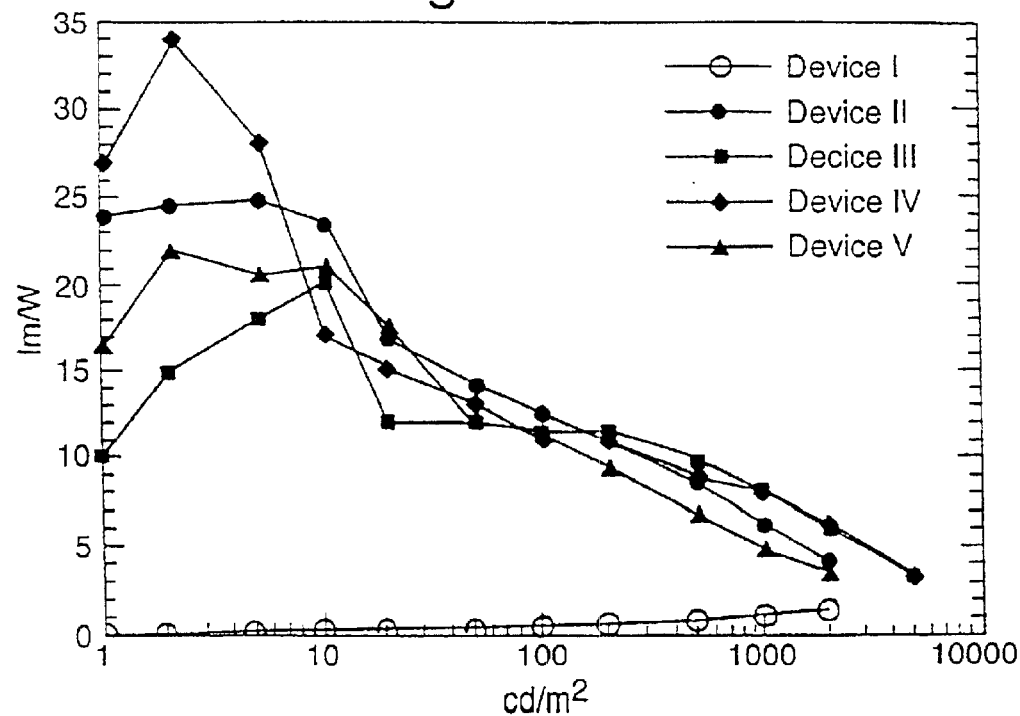
FIG. 15 shows the power efficiency of devices I–V against brightness.
Figure 10:
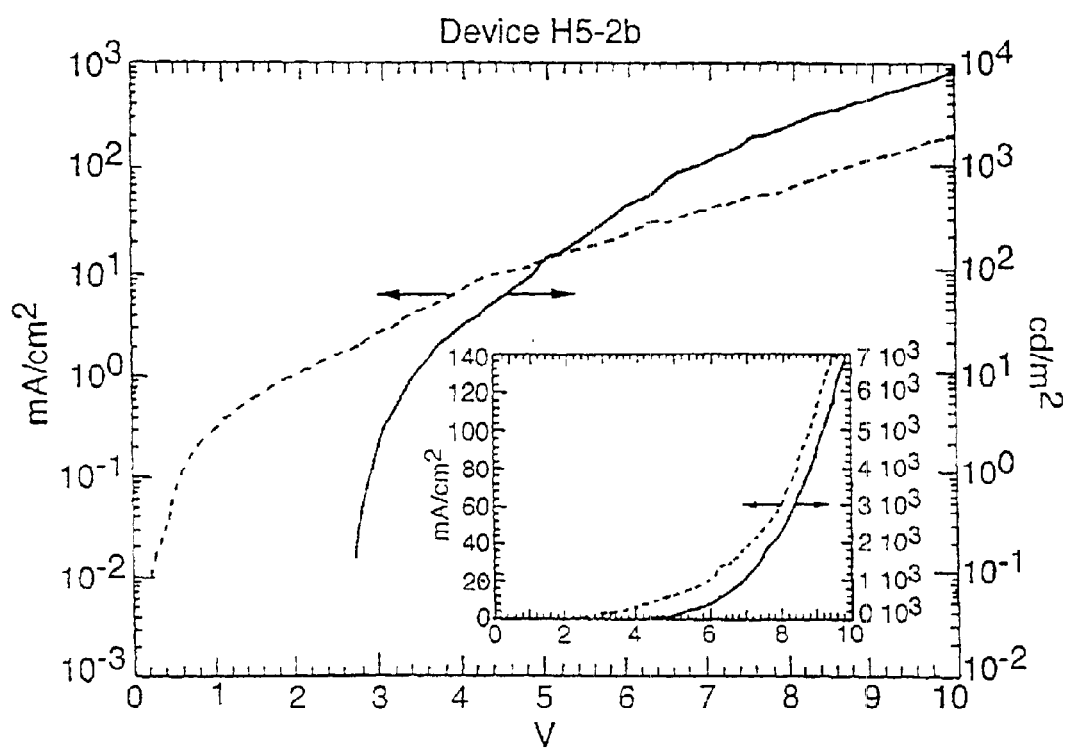
FIGS. 10–14 show the current and light-output performance an efficiency against voltage of devices I–V respectively.
Figure 10:
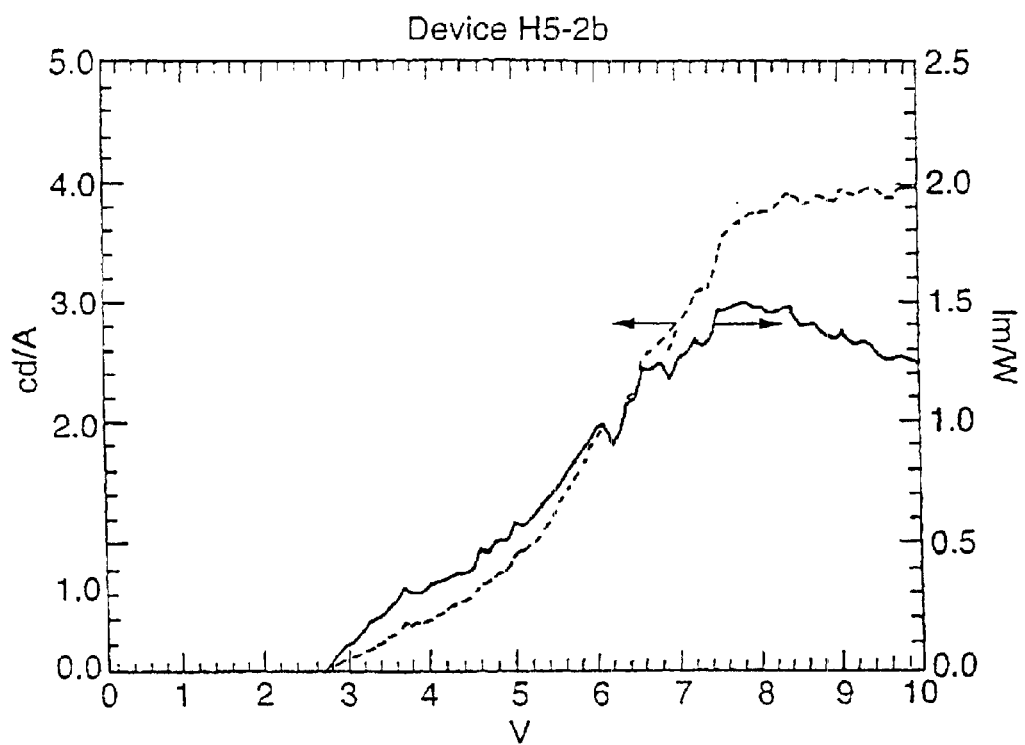
Figure 11:
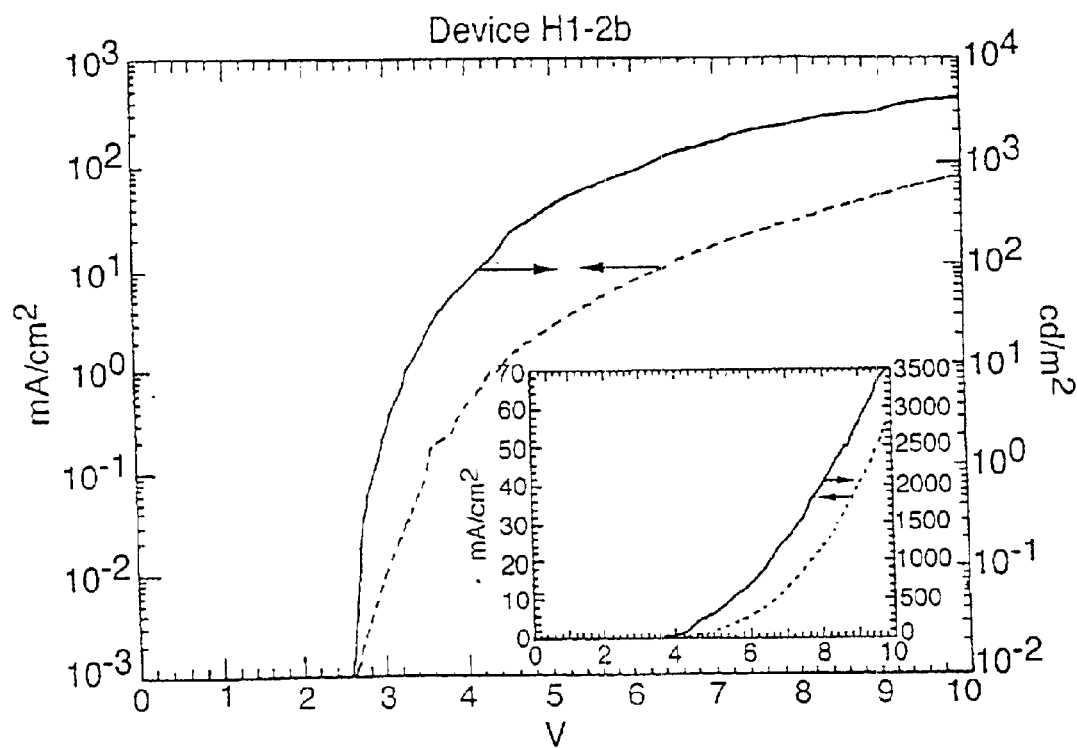
Figure 11:
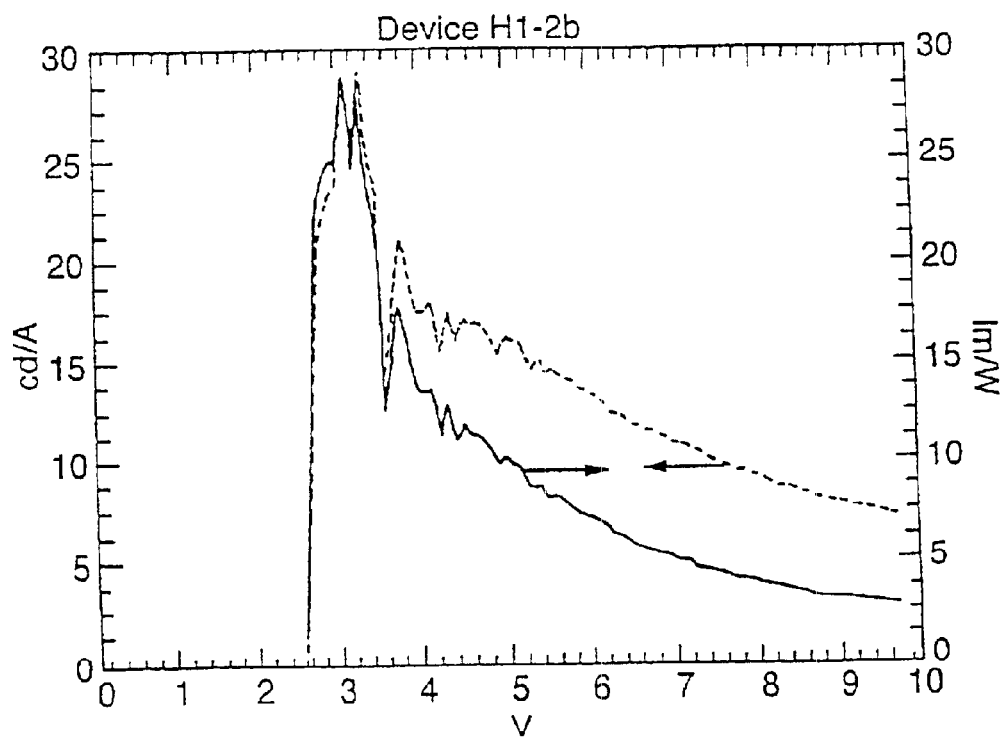
Figure 12:
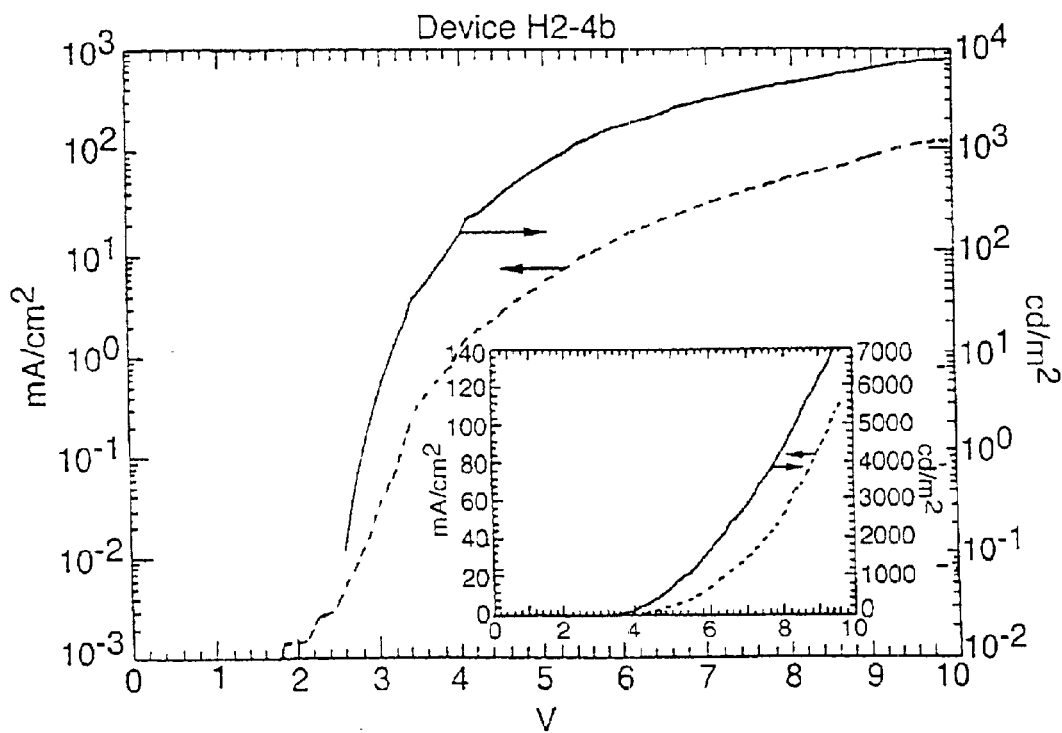
Figure 12:
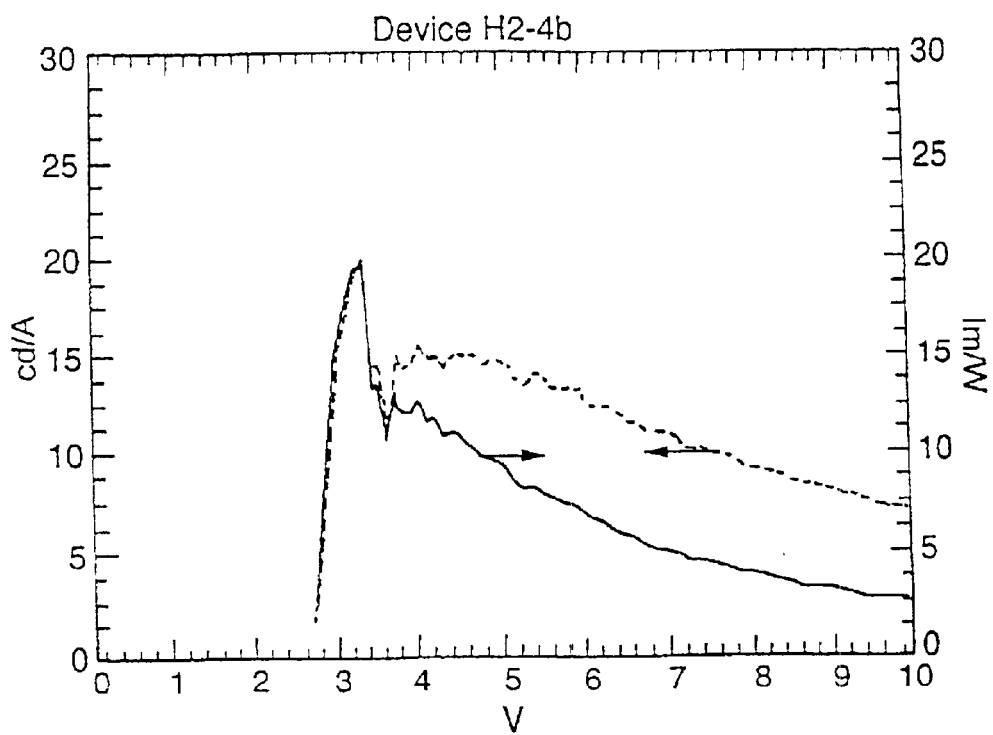
Figure 13:
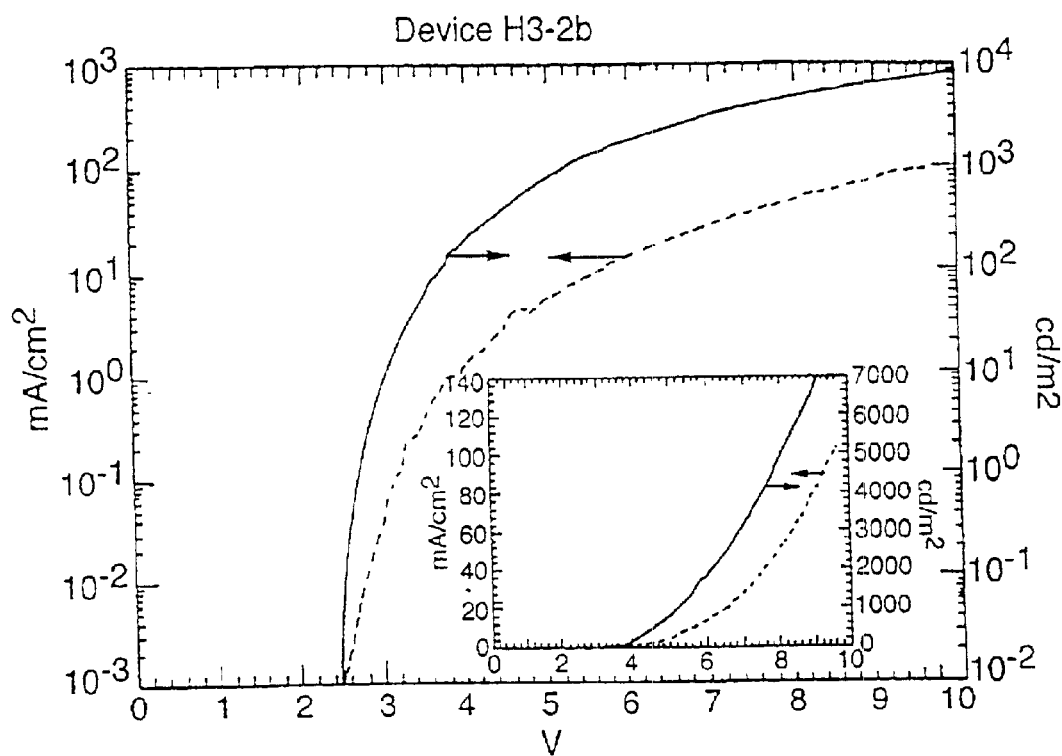
Figure 13:
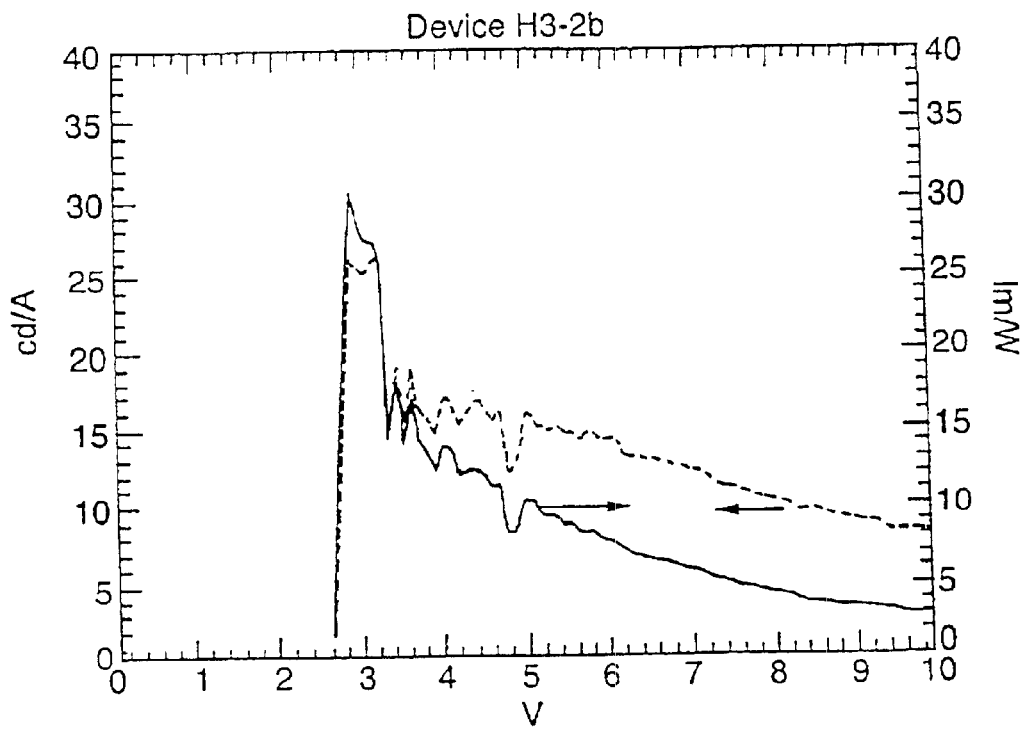
Figure 14:
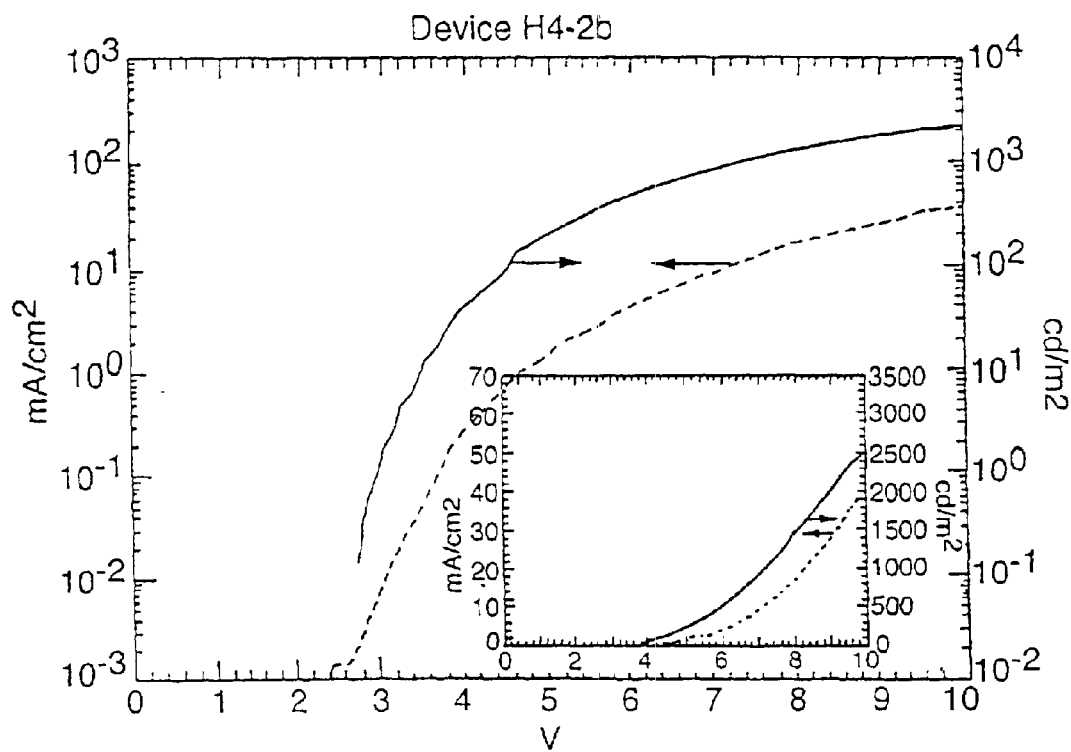
Figure 14:
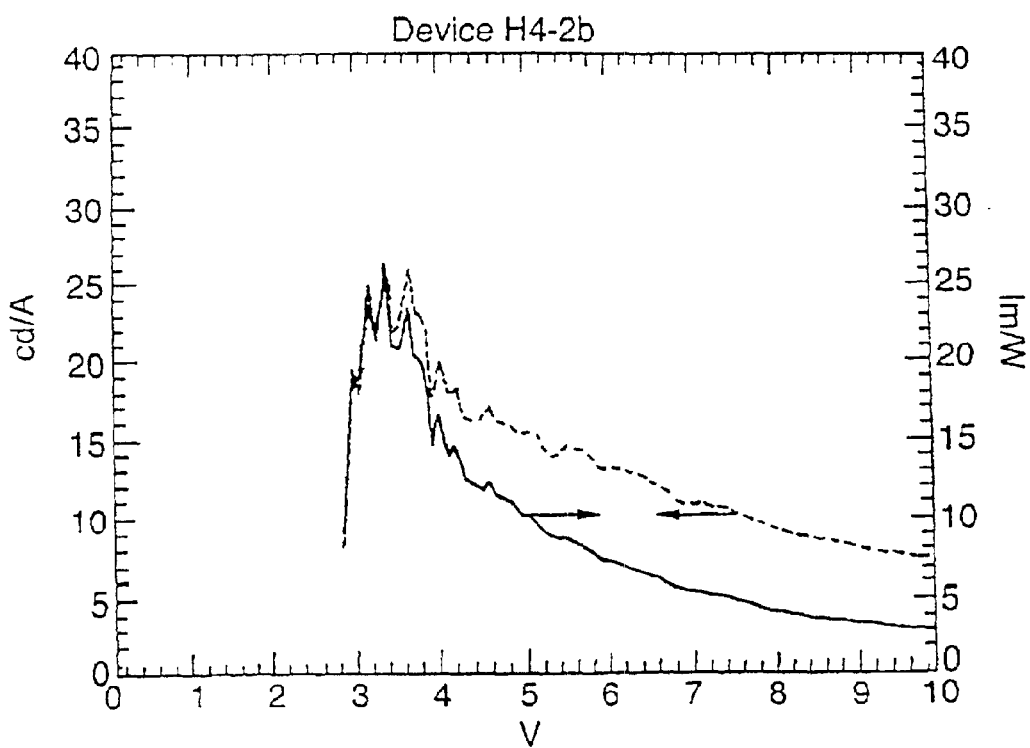

The results indicate that the stratified PEDOT:PSS/PPV interlayer significantly improves the device power efficiency over the control device built with PEDOT:PSS alone. From the table above, a thirty-fold to forty-fold improvement in power efficiency at a moderately low drive of 3–4 V and a brightness of about 10 cd/m² is achieved for the interlayer devices II to V. At even lower voltages, these devices are even more efficient. Power efficiencies up to 20–30 lm/W are readily attained just after device turn-on. (See FIG. 15, which plots the power efficiency of the devices against brightness). The power efficiency decreases with increasing drive voltage and brightness. However, even at a moderately high brightness of 1000 cd/m², a twofold to threefold enhancement over the control device is still achieved. One approach to shifting the high lm/W values to higher brightnesses is to increase the thickness of the 5BTF8 layer. In particular, the thickness could be increased to around 1000, 1200, 1500 or even up to around 2000 Å.

Figure 16A:
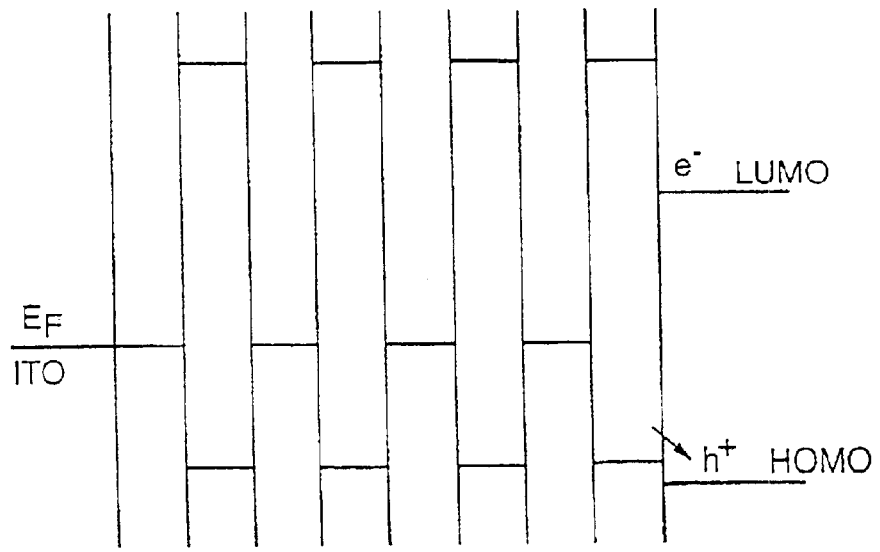
FIGS. 16a and 16b illustrate energy levels in two example devices.

The PEDOT:PSS/PPV interlayer configuration is thought to provide a hole-transport but electron-blocking function that facilitates charge recombination and helps confine the excitations to the emitter layer. The presence of semiconducting PPV layers in the stratified PEDOT:PSS/PPV assembly, especially as the termination layer, is believed to play an important role in this. The semi-converted PPV is expected to have the LUMO level for electron-transport several tenths of an electron-volt higher than that of PEDOT, F8BT and F8 (see FIG. 16a), which could exert a blocking effect on the electrons crossing the interface from the opposite direction. The confined electrons would advantageously redistribute the electric field in the device to improve the balance of electrons and holes injected into the device. The PPV layer would also assist in isolating the subsequently formed excitations from direct contact with the ITO anode, which leads to some non-radiative loss. The PEDOT on the other hand provides a hole-transport function to the interlayer, assisting in hole-injection across the interface with the emitter layer. The net effect would then be improved electron-hole balance coupled to an improved electron-hole capture and a higher fraction of radiative recombination. This is believed to lead to the greatly improved power efficiency that is observed in the interlayer devices.

As a result, of the transport layer the drive voltage needed to produce a selected light output is considerably reduced for these interlayer devices. This is highly desirable because it reduces the electrical stress in the device during operation, which then usually leads to longer operating lifetimes. The reduction in drive voltage is most marked for the graded interlayer devices II and IV. For example, the voltage needed to produce 1000 cd/m² drops from 7.1 V for the control device I, to 6.3 V in the interlayer device II, and further to 5.5 V for the graded interlayer devices III and IV. The improvement in devices with the electronically-graded interlayer is largely attributed to an increased ease in current injection, together with a lesser contribution arising from a weak enhancement of their power efficiencies. This is demonstrated more clearly in FIG. 17, which plots the current density through the different devices against applied voltage, and FIG. 18, which plots the drive voltage for the various devices against brightness. Therefore, it is clearly shown that a gradation in electronic properties could be built into an interlayer, and that such a gradation could be exploited to improve the performance of OLEDs.

Figure 16B:
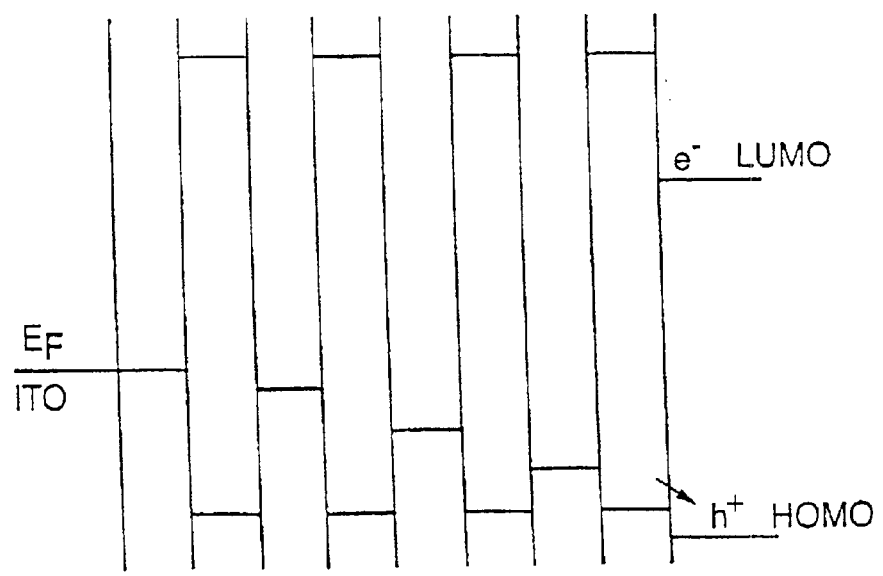

It is thought that the gradation in the conductivity or the HOMO level for hole transport leads to a picture that is schematically shown in FIG. 16b. The fabrication of an interlayer in which hole- or electron-transport states that more closely match in energy (and or molecular properties) to those in the adjoining layers with a gradation in-between reduces the thermodynamic energy mismatch for charge transport between adjacent layers. The thermodynamic barrier at the injection interface becomes smaller and less abrupt in the graded interlayer devices than in conventional bilayer devices utilising for example a fully-doped PEDOT layer which gives an electronically abrupt interface between it and the emitting polymer. Further, such a gradation may also prevent the electric field from developing abruptly at the interface by allowing a gradual change through the interlayer itself. This could reduce charge accumulation at the interfaces, which usually leads to enhanced device degradation. In summary, such a spatial grading in the electronic properties of the inter layer therefore allows a more balanced electron-hole injection to be achieved at lower drive voltages in OLEDs.

As discussed above, the at least one polymer layer has an electronic and/or optical property that varies across the thickness of the layer. Some preferred (but not essential) general features of this aspect of the present method will now be described.

Preferably, when the polymer layer comprises a series of bilayers, each bilayer is formed of two components, one of which is preferably a semiconductor (e.g. PPV) and the other of which is preferably conductive (e.g. PEDOT-PSS). The semiconductor (if present) preferably provides an intermediate energy level between the conductive material (if present) and the emissive material of the device. Preferably the sub-layer that abuts (or is closest to) the emissive material is a sub-layer of the semiconductor. There could be another layer (e.g. a conductive layer) between the last sub-layer and the emissive material. The components of successive bilayers need not be the same—for example different conductive materials could be used in each layer. One or more of the bilayers may be replaced by layers that have more than two sub-layers. Each sub-layer is suitably formed of a polymer material and is preferably one polymer chain deep (the precise thickness being determined by the conformation of the chain). In some preferred embodiments a conduction energy level of the conductive material varies between successive bilayers, and preferably in the direction towards the emissive material it increases or decreases between successive bilayers towards a HOMO or LUMO level of the emissive material. Especially where the properties of the conductive material vary in this way another layer could be omitted and the bilayers replaced, in effect, by monolayers. The process could be applied to devices other than light-emissive devices, especially in cases where charge injection is to be improved.

It is believed that the PSS may dope the PPV to some degree, with the degree of doping increasing if the PPV is converted by baking at higher temperatures such as greater than 100° C.

It should be noted that the interlayer devices show sharp (diode-like) turn-on characteristics like those of conventional bilayer devices, which contrasts with single-layer 5BTF8 devices.

Importantly, the present method allows especially fine control over gradation of electronic properties (e.g. doping) and the benefits of such gradation.

This fabrication method provides a means to exploit layer-by-layer forming techniques to build an interlayer with controlled variation of one or more electronic and/or optical parameters such as energy levels or energy level distributions (especially those that are responsible for charge carrier transport), the effective work function, electron affinity, ionisation energy and/or band gap across the interlayer thickness. By matching one or more of these to the characteristics of one or more of the materials adjacent to the interlayer in a finished device, an advantageous manipulation of barrier (e.g. energy barrier) heights and widths may be achieved. This may then provide additional control parameters that could be exploited to optimise the performance of a light emitting device (especially an organic light emitting device) in terms of brightness, efficiency, lifetime, drive voltage and/or colour.

The method also exploits composition grading as a means to allow for matching of the molecular interaction parameters with the material on both sides of the interlayer, so that the desired level of adhesion could be maintained between the two materials in contact with the interlayer. This may also allow further optimisation of device performance.

This approach to gradation through the thickness of the PEDOT-PSS layer may be applied to other materials, especially polymers (including oligomers). The approach may be used to provide a variation in one or more of the following characteristics through the thickness of the layer: composition, level of doping, electron affinity, ionisation potential, work function, band gap and molecular interaction to control charge injection and/or adhesion. Preferably this variation is provided by the PEDOT-PSS layer comprising a plurality of sub-layers of differing compositions. Alternative materials could be used in devices that embody the principles described above. For example, sulphonated or other appropriately derivatised polyanilines, polythiophenes, poly (vinylcarbazoles), poly(vinylnaphthalenes) or materials based on those, or other materials.

In a light emissive device the graded layer may suitably lie adjacent to the light-emitting material, either at the interface between the anode or layers in contact with the anode (e.g. PEDOT) and the emitting material; and/or at the interface between the cathode or layers in contact with the cathode and the emitting polymer; and/or at the interface between two light-emitting materials. The thickness of the graded layer is suitably in the range from 5 to 1000 Å or more, preferably in the range from 5 to 200 Å or more.

The graded layer is suitably a polymer layer, preferably a polymer interlayer. The graded layer is suitably formed either by deposition of a series of sub-layers of differing properties (e.g. composition) or by deposition of a layer (or a series of sub-layers) with some or all deposition steps or just the final deposition step being followed by a step to modify the properties of at least the last-deposited layer/sub-layer. The layers or sub-layers may be in the form of films.

The finished graded layer suitably has a composition variation in its thickness direction. This suitably leads to a variation in electronic or molecular properties across its thickness. This spatial variation in composition could be diffuse or abrupt, and could extend through all or part of the thickness of the layer. The variation could, for example, derive from two or more completely distinct chemical entities (such as PEDOT and PPV as in device I) put together in a sequential manner, or from continuous variation in the level of doping or dedoping (such as PEDOT with a different degree of backbone charging as in devices II–IV) of the interlayer material. The variation in composition could be present when the layer is first fabricated or could be induced by physical and/or chemical treatments subsequent to its fabrication, for example by exposure to electromagnetic radiation (such as UV radiation), or high-energy particles like those contained in plasma, or by chemical reactions limited by one or more of diffusion, stoichiometry, time, reactivity and concentration.

To demonstrate the advantages of the present invention larger 16 mm$^2$ devices have been constructed using a variant of the materials employed in the self-assembly based on the general principles of ultrathin polymer interlayers and graded-transport interlayers embodied in the invention:

All the following devices have as the emitter layer 800-Angstrom 5BTF8 deposited by spin-coating, and a cathode contact of 1000-Angstrom Ca overlaid with a protective 5000-Angstrom Ag. Altogether 24 pixels of each type were fabricated.

Device X: ITO/quartenised ammonium propyl silyl coupling layer (PEDOT:PSS/PPV-THT)$_5$/(PSS/PPV-THT)$_1$/5F8BT/Ca/Ag This device has an ultrathin (less than 100-Angstrom) charge-injection interlayer at the ITO anode interface fabricated from a uniformly conducting polymer in the interlayer provided by the fully doped PEDT:PSS, and capped with a superthin (10-Angstrom) semiconducting layer provided by PPV-THT.

Device Y: ITO/quartenised ammonium propyl silyl coupling layer/(PEDOT:PSS/PVV-THT)$_5$/(PSS/PPV-THT)$_1$/5F8BT/Ca/Ag This device has an ultrathin charge-injection interlayer with a graded-transport profile fabricated by sequential dedoping of the PEDOT:PSS during growth, and ultimately capped with a superthin semiconducting layer provided by PPV-THT.

Device Z: ITO/PEDOT:PSS/5BTF8/Ca/Ag This is the control device against which the performance of Device X and Y are compared.

The PEDOT:PSS layer of thickness 500-Angstrom was deposited by spin-coating.

FIGS. 19–21 show the representative performance of Devices X to Z respectively.

The data clearly show that Device X fabricated with an ultrathin hole-transport layer (less than 100-Angstrom) of PEDOT:PSS/PPV deposited by alternate polyelectrolyte adsorption gives similar performance to the Control Device fabricated with a much thicker PEDOT:PSS hole-transport layer fabricated by conventional spin-coating. Maximum luminous efficiency for Device X is 5 lm/W which occurs at a drive voltage of 4.0 V and a light output of 20 cd/m$^2$, very similar to control Device Z. A relatively slow turn-on characteristic is obtained. The drive voltage required for 100 cd/m$^2$ is also similar (5.0V) for both cases, at which a drive current density of about 10 mA/cm$^2$ passes through the device. At even higher voltages, the effects of the superthin (10-Angstrom) PSS/PPV capping layer in increasing the device resistance and thus limiting the drive current becomes apparent.

Compared to Device X, Device Y shows a marked improvement in both the luminous efficiency achieved and drive current that could be passed through the device for a selected voltage. This markedly enhances its light output relative to the other two devices. Maximum luminous efficiency is about 13 lm/W at about 3.0 V. A sharp turn-on in device performance is seen at 2.1 V. A light-output of 100 cd/m$^2$ is achieved at a 4.5 V, which gives a current density of 10 mA/cm$^2$.

The results demonstrate the significant flexibility inherent in the design principles of the invention can be exploited to improve the performances of OLEDs by appropriate material selection and fabrication of ultrathin charge-injection interlayers and especially controlled gradation in the transport-properties in the thickness direction of this layer.

What is claimed is:

1. A method of fabricating an organic light-emitting device, which method comprises the steps of:
   providing a substrate comprising a first electrode and a glass or a plastics material;
   either forming by self-assembly at least one polymer layer over the first electrode and forming other than by self-assembly at least one layer of organic light emissive material over the at least one polymer layer; and forming a second electrode for the device over the at least one layer of organic light emissive material;
   or forming other than by self-assembly at least one layer of organic light emissive material over the first electrode and forming by self-assembly at least one polymer layer over the at least one layer of organic light emissive material; and forming a second electrode for the device over the at least one polymer layer; and
   removing physisorbed water from the surface of the substrate prior to forming the at least one polymer layer, wherein the physisorbed water is removed by heating.

2. A method according to claim 1, which method further comprises forming a coupling layer prior to forming the at lest one polymer layer.

3. A method according to claim 2, wherein the coupling layer is formed by silylating the substrate.

4. A method according to claim 1, which method further comprises preparing the substrate surface such that the surface charge of the substrate is pH independent.

5. A method according to claim 1, wherein the substrate comprises amino groups, the method further comprises quaternising amino groups to form positively charged quaternised species on the surface.

6. A method according to claim 1, wherein when the substrate comprises thiol groups, the method further comprises the step of oxidizing thiol groups to form negatively charged species on the surface.

7. A method according to claim 1, wherein the plastics material comprises one or more of a polyester, a polycarbonate or a poly(ether amide).

8. A method according to claim 1, wherein the at least one self-assembled polymer layer comprises one or more pairs of co-operating sub-layers.

9. A method according to claim 8, wherein the one or more pairs of co-operating sub-layers interact by attractive forces, each sub-layer being dissimilar to the other.

10. A method according to claim 9, wherein one sub-layer of a pair is negatively charged and the other sub-layer of the pair is positively charged.

11. A method according to claim 8, wherein the one or more pairs of co-operating sublayers interact by donor/acceptor interaction.

12. A method according to claim 11, wherein the donor/acceptor interaction is provided by hydrogen bonding.

13. A method according to claim 8, wherein each sub-layer of the cooperating pairs of sub-layers is 0.3–2 nm thick.

14. A method according to claim 1, wherein the at least one polymer layer is 0.3–20 nm thick.

15. A method according to claim 1, wherein the organic material comprises a conjugated polymer and/or a low molecular weight compound.

16. A method according to claim 15, wherein the organic material comprises a semi conductive conjugated polymer.

17. A method according to claim 16, wherein the organic material comprises PPV or a derivative thereof.

18. A method according to claim 1, wherein the at least one layer of organic light-emissive material is 30–1000 nm thick.

19. A method of fabricating an organic light-emitting device which method comprises the steps of:
   forming a first electrode for the device over a substrate, wherein said substrate comprises a glass or a plastics material;
   either removing physisorbed water by heating from the surface of the first electrode, forming a coupling layer, forming, by self-assembly, at least one polymer layer over the first electrode, and forming at least one layer of organic light emissive material over the at least one polymer layer;
   or forming at least one layer of organic light emissive material over the first electrode, removing physisorbed water by heating from the surface of the at least one organic light-emissive material, forming a coupling layer, and forming, by self-assembly, at least one polymer layer over the at least one layer of light emissive material; and
   forming a second electrode for the device over the at least one layer of light emissive material.

20. A method according to claim 19, wherein the at least one polymer layer has an electronic and/or optical property that varies across the thickness of the layer.

21. A method according to claim 20, which method additionally comprises the step of processing the at least one polymer layer to form the spatial variation in the electronic and/or optical property.

22. A method according to claim 21, wherein the at least one polymer layer comprises a conjugated material and the step of forming the spatial variation in the electronic and/or optical property comprises reducing the degree of conjugation of the conjugated material.

23. A method according to claim 21, wherein the step of processing the at least one polymer layer comprises exposing the polymer layer to a reactive agent to promote a chemical reaction in the at least one polymer layer.

24. A method according to claim 23, wherein the reaction is an oxidation or reduction reaction.

25. A method according to claim 23, wherein the reactive agent is an oxidizing agent.

26. A method according to claim 23, wherein the agent is oxygen.

27. A method according to claim 23, wherein the agent is in the form of a plasma.

28. A method according to claim 20, wherein the step of forming the at least one polymer layer comprises forming the polymer layer in a state in which the electronic and/or optical property varies across its thickness.

29. A method according to claim 28, wherein the polymer layer is deposited in a series of sub-layers.

30. A method according to claim 28, wherein the polymer layer is deposited in the form of a series of bi-layers each containing two sub-layers of different materials.

31. A method according to claim 28, wherein the polymer layer is deposited so as to comprise a series of sub-layers of a material which each differ in the electronic and/or optical property.

32. A method according to claim 31, wherein the sub-layers of a material are graded in the said property across the thickness of the polymer layer.

33. A method according to claim 31, wherein the material comprises poly(styrenesulphonic acid).

34. A method according to claim 31, wherein the sub-layers are doped so as to achieve the difference in the electronic and/or optical property.

35. A method according to claim 33, wherein in at least some of the sub-layers the poly(styrenesulphonic acid) is doped with poly(ethylenedioxythiophene).

36. A method according to claim 20, wherein said property is an energy level or an energy level distribution.

37. A method according to claim 36, wherein said property is ionisation potential.

38. A method according to claim 20, wherein in a direction from the first electrode to the light emissive layer the ionisation potential of the polymer layer varies away from the conduction band of the first electrode.

39. A method according to claim 20, wherein in a direction from the first electrode to the light emissive layer the ionisation potential of the polymer layer varies towards the HOMO level of the light emissive layer.

40. A method according to claim 20, wherein the optical gap of the light emissive layer varies in a direction from the first electrode to the second electrode.

41. An organic light emitting device, obtainable according to a method as defined in claim 1.

42. An organic light emitting device comprising: at least one layer of organic light-emissive material between a first electrode and a second electrode, the at least one organic light-emissive material having been formed other than by self-assembly; and at least one polymer layer between one of the first and second electrodes and the at least one organic light-emissive material, the at least one polymer layer being formed by self-assembly, wherein the at least one polymer layer has an electronic and/or optical property that varies across the thickness of the layer.

43. A method of fabricating an organic light-emitting device, which method comprises the steps of:

providing a substrate comprising a first electrode and a glass or a plastics material;

either forming by self-assembly at least one polymer layer over the first electrode and forming other than by self-assembly at least one layer of organic light emissive material over the at least one polymer layer; and forming a second electrode for the device over the at least one layer of organic light emissive material;

or forming other than by self-assembly at least one layer of organic light emissive material over the first electrode and forming by self-assembly at least one polymer layer over the at least one layer of organic light emissive material; and forming a second electrode for the device over the at least one polymer layer;

wherein the at least one self-assembled polymer layer comprises one or more pairs of co-operating sub-layers, and wherein the one or more pairs of co-operating sub-layers interact by donor/acceptor interaction.

44. A method of fabricating an organic light-emitting device which method comprises the steps of:

forming a first electrode for the device over a substrate, wherein said substrate comprises a glass or a plastics material;

either removing physisorbed water from the surface of the first electrode, forming a coupling layer, forming, by self-assembly, at least one polymer layer over the first electrode, and forming at least one layer of organic light emissive material over the at least one polymer layer;

or forming at least one layer of organic light emissive material over the first electrode, removing physisorbed water from the surface of the at least one organic light-emissive material, forming a coupling layer, and forming, by self-assembly, at least one polymer layer over the at least one layer of light emissive material; and forming a second electrode for the device over the at least one layer of light emissive material, wherein the at least one polymer layer has an electronic and/or optical property that varies across the thickness of the layer.

* * * * *

UNITED STATES PATENT AND TRADEMARK OFFICE
CERTIFICATE OF CORRECTION

PATENT NO.     : 6,850,003 B1
DATED          : February 1, 2005
INVENTOR(S)    : Pichler et al.

It is certified that error appears in the above-identified patent and that said Letters Patent is hereby corrected as shown below:

Column 19,
Line 35, delete "lest" and substitute -- least --.

Signed and Sealed this

Seventeenth Day of May, 2005

JON W. DUDAS
*Director of the United States Patent and Trademark Office*